（12）United States Patent
Biltz et al.

(10) Patent No.: US 8,893,035 B2
(45) Date of Patent: Nov. 18, 2014

(54) METHOD, SYSTEM AND GRAPHICAL USER INTERFACE FOR CONFIGURING A SIMULATOR TO SIMULATE A PLURALITY OF DEVICES

(75) Inventors: Michael J. Biltz, San Francisco, CA (US); Jonathan Hsu, Cupertino, CA (US); Sean Stauth, San Francisco, CA (US); Graeme D. MacDonald, San Francisco, CA (US)

(73) Assignee: Accenture Global Services Limited, Dublin (IE)

( * ) Notice: Subject to any disclaimer, the term of this patent is extended or adjusted under 35 U.S.C. 154(b) by 493 days.

(21) Appl. No.: 12/212,573

(22) Filed: Sep. 17, 2008

(65) Prior Publication Data

US 2010/0070909 A1    Mar. 18, 2010

(51) Int. Cl.
| | |
|---|---|
| *G06F 3/048* | (2013.01) |
| *G06G 7/48* | (2006.01) |
| *G06F 9/44* | (2006.01) |
| *G06F 17/50* | (2006.01) |
| *G06G 7/66* | (2006.01) |
| *G06Q 99/00* | (2006.01) |
| *G06F 3/0484* | (2013.01) |

(52) U.S. Cl.
CPC .......... *G06F 9/4443* (2013.01); *G06F 3/04847* (2013.01); *G06F 17/5036* (2013.01)
USPC .............. 715/781; 715/764; 703/13

(58) Field of Classification Search
CPC ...... G06Q 10/06; G06Q 30/02; H04L 69/329; H04L 65/1069
USPC .......................... 715/781, 964, 764
See application file for complete search history.

(56) References Cited

U.S. PATENT DOCUMENTS

| | | | |
|---|---|---|---|
| 4,008,476 A | * | 2/1977 | Evans, Jr. ................. 342/169 |
| 5,388,264 A | | 2/1995 | Tobias, II et al. |
| 5,408,638 A | * | 4/1995 | Sagawa et al. .............. 703/2 |
| 5,479,355 A | * | 12/1995 | Hyduke ..................... 703/14 |
| 5,713,075 A | | 1/1998 | Threadgill et al. |

(Continued)

OTHER PUBLICATIONS

Chen Zhenzhen, Zhang Jlnhua, Design and Implementation of GUI software for Real-time Electro-Magnetic Transient Simulation based on PC cluster. 2004 International Conference on Power System Technology—POWERCON 2004, Singapore, Nov. 21.24, 2004. 0-7803-861 0-8/041$20.00 0 2004 IEEE. pp. 128-132.*

(Continued)

*Primary Examiner* — Steven B Theriault
*Assistant Examiner* — Amy M Levy
(74) *Attorney, Agent, or Firm* — Fish & Richardson P.C.

(57) ABSTRACT

A method, system and graphical user interface for configuring a simulator. A graphical user interface may be used to define a configurable device profile, where a large number of devices for simulation by a simulator may be created based upon the configurable device profile. Once created, the devices may be individually configured and/or configured in groups. Additionally, the configuration of the devices may determine how the simulator generates and/or outputs simulated device data for the devices. For example, an attribute may be associated with a device which defines a format of the simulated device data, a rate at which the simulated device data is output, a range of values for the simulated device data, or an operating parameter of the device. An attribute specifying the communicative coupling of the devices may also be defined. Further, the simulated device data may include a data value.

26 Claims, 18 Drawing Sheets

(56) References Cited

U.S. PATENT DOCUMENTS

| | | |
|---|---|---|
| 5,722,418 A | 3/1998 | Bro |
| 5,819,092 A | 10/1998 | Ferguson et al. |
| 5,867,494 A | 2/1999 | Krishnaswamy et al. |
| 5,872,810 A | 2/1999 | Philips et al. |
| 5,901,246 A | 5/1999 | Hoffberg et al. |
| 6,078,739 A * | 6/2000 | Paterson et al. ............ 703/6 |
| 6,163,772 A | 12/2000 | Kramer et al. |
| 6,185,409 B1 | 2/2001 | Threadgill et al. |
| 6,212,566 B1 | 4/2001 | Vanhoof et al. |
| 6,256,773 B1 | 7/2001 | Bowman-Amuah |
| 6,268,853 B1 * | 7/2001 | Hoskins et al. .............. 700/83 |
| 6,289,382 B1 | 9/2001 | Bowman-Amuah |
| 6,307,877 B1 | 10/2001 | Philips et al. |
| 6,317,438 B1 | 11/2001 | Trebes, Jr. |
| 6,324,525 B1 | 11/2001 | Kramer et al. |
| 6,324,647 B1 | 11/2001 | Bowman-Amuah |
| 6,335,927 B1 | 1/2002 | Elliott et al. |
| 6,340,977 B1 | 1/2002 | Lui et al. |
| 6,345,239 B1 | 2/2002 | Bowman-Amuah |
| 6,393,341 B1 * | 5/2002 | Lawrence et al. ........... 700/286 |
| 6,400,996 B1 | 6/2002 | Hoffberg et al. |
| 6,418,424 B1 | 7/2002 | Hoffberg et al. |
| 6,453,420 B1 | 9/2002 | Collart |
| 6,597,727 B2 | 7/2003 | Philips et al. |
| 6,636,721 B2 | 10/2003 | Threadgill et al. |
| 6,640,145 B2 | 10/2003 | Hoffberg et al. |
| 6,735,630 B1 | 5/2004 | Gelvin et al. |
| 6,769,130 B1 | 7/2004 | Getsin et al. |
| 6,788,688 B2 | 9/2004 | Trebes, Jr. |
| 6,813,777 B1 | 11/2004 | Weinberger et al. |
| 7,076,411 B2 * | 7/2006 | Santori et al. ................ 703/6 |
| 7,313,511 B2 * | 12/2007 | Shahabuddin et al. ....... 703/19 |
| 7,467,018 B1 * | 12/2008 | Callaghan ..................... 700/1 |
| 7,562,001 B2 * | 7/2009 | Arevalo et al. ............... 703/14 |
| 2001/0049594 A1 * | 12/2001 | Klevans ......................... 703/14 |
| 2002/0130834 A1 * | 9/2002 | Madarasz et al. ........... 345/156 |
| 2002/0136224 A1 | 9/2002 | Motley |
| 2003/0040897 A1 * | 2/2003 | Murphy et al. ............... 703/18 |
| 2004/0078182 A1 * | 4/2004 | Nixon et al. .................. 703/22 |
| 2004/0249482 A1 * | 12/2004 | Abu El Ata et al. .......... 700/44 |
| 2005/0147089 A1 | 7/2005 | Gerszberg et al. |
| 2005/0283756 A1 | 12/2005 | O'Dwyer |
| 2006/0112397 A1 | 5/2006 | Raghunandan et al. |
| 2006/0206866 A1 * | 9/2006 | Eldrige et al. ................ 717/122 |
| 2007/0006171 A1 | 1/2007 | Raghunandan et al. |
| 2007/0211079 A1 * | 9/2007 | Nixon et al. .................. 345/619 |
| 2007/0255869 A1 | 11/2007 | Walters et al. |
| 2007/0282576 A1 * | 12/2007 | Butine ........................... 703/6 |
| 2007/0288856 A1 | 12/2007 | Butlin et al. |
| 2008/0001713 A1 * | 1/2008 | Dasgupta et al. ............. 340/10.1 |
| 2009/0319647 A1 * | 12/2009 | White et al. .................. 709/221 |

OTHER PUBLICATIONS

Yiyou Dong, Jianhua Yang, and Zhaohui Wu. ODSG: An Architecture of Ontology-based Distributed Simulation on Grid. Proceedings of the First International Multi-Symposiums on Computer and Computational Sciences (IMSCCS'06) 0-7695-2581-4/06 $20.00 © 2006 IEEE.*

Eric Bonabeau. Agent-based modeling: Methods and techniques for simulating human systems. 7280-7287 PNAS May 14, 2002 vol. 99 suppl. 3 www.pnas.org/cgi/doi/10.1073/pnas.082080899.*

Youngjin Jung et al. An Embedded Integration Prototyping System Based on Component Technique. R. Obermaisser et al. (Eds.): SEUS 2007, LNCS 4761, pp. 171-180, 2007. © IFIP International Federation for Information Processing 2007.*

Song et al, SPTP: A Simulation Platfor for Network Node Performance Evaluation. CCEC 2004-CCGEI 2004 Niagra Falls, May 2004 0-7803-8253-6/04/$17.00 (c) 2004 IEEE pp. 369-372.*

Edvardsson. A Graphical User Interface for Configuring a Virtual Computer. Masters Thesis. School of Computer Science and Engineering, Royal Institute of Technology, Stockholm, Apr. 2003.*

IEEE 100. The Authoritative Dictionary of IEEE Standards Terms Seventh Edition, 2000. p. 204.*

Engbloom et al. Developing Embedded Networked Products using the Simics Full-System Simulator. 2005 IEEE 6th International Symposium on Personal, Indoor and Mobile Radio Communications. Sep. 2005.*

Magnusson et al. Simics: A Full System Simulation Platform. IEEE Computer Magazine. Feb. 2002. pp. 50-58.*

Cervin et al. TrueTime: Simulation tool for performance analysis of real-time embedded systems. 2009. [PDF] [retrieved from] http://control.lth.se/documents/2009/cer+arz09.pdf [retrieved] Mar. 24, 2013.*

Allen-Bradley Company. Smart Transmitter Interface Products (HART Protocol) Cat. Nos. 1770-HT1, 1770-HT8, 1770-HT16 User Manual. Publication 1770-6.5.19, Jul. 1993.*

Bajaj, Lokesh, et al. Glomosim: A scalable network simulation environment. UCLA Computer Science Department Technical Report 990027 (1999).*

Pratap et al. A Survey of Simulation in Sensor Networks. CIMCA 2008, IAWTIC 2008, and ISE 2008.*

Baumgart et al. OverSim: A Flexible Overlay Network Simulation Framework. In IEEE Global Internet Symposium, May 2007. pp. 79-84.*

He et al. Layer abstraction for simulation scalability improvements in large-scale sensor networks. Third International Conference on Networked Sensing Systems (INSS'06) [retrieved] http://citeseerx.ist.psu.edu/viewdoc/download?doi=10.1.1.75.2360 [on] Jul. 15, 2013.*

Varga et al. An overview of the OMNeT++ Simulation environment, SIMUTools, Mar. 3-7, 2008, Marseille, France.*

Pan, Jianli. A Survey of Network Simulation Tools: Current Status and Future Developments, Nov. 24, 2008, accessed [http://www.cse.wustl.edu/~jain/cse567-08/index.html] on [Dec. 23, 2013].*

Solon, Anthony; TeleMorph & TeleTuras: Bandwidth determined Mobile MultiModal Presentation; First Year Report, School of Computing and Intelligent Systems; Dec. 2003; University of Ulster, Magee.

Lee, J., et al.; A Framework for Automatic Generation of Configuration Files for a Custom Hardware/Software RTOS; School of Electrical and Computer Engineering; 2002; Georgia Institute of Technology, Atlanta, Georgia, U.S.A.

Helsinki; ETX-Electronics for the Information Society 1997-2001; Technology Programme Report; Mar. 2002; TEKES—National Technology Agency.

Subramanian, V.; Configurable Architecture for System-Level Prototyping of High-Speed Embedded Wireless Communication Systems; Thesis submitted to the faculty of the Virginia Polytechnic Institute and State University; Jan. 13, 2003; Blacksburg, Virginia.

* cited by examiner

700

| CREATE DEVICE PROFILE | | |
|---|---|---|
| PROFILE ID | 28 | — 710 |
| PROFILE TYPE | SENSOR ▾ | — 720 |
| PROFILE NAME | SENSORTYPEA | — 730 |
| PROFILE DATA RANGE | | — 740 |
| FREQUENCY OF DATA: EVERY X MIN | | — 750 |
| BATTERY LIFE | | — 760 |
| FORMAT OF DATA | | — 770 |

785 —

| NEW ATTRIBUTES | | |
|---|---|---|
| NAME | TYPE | RANGE |
| TEMPERATURE | DECIMAL | 50-70 |
| | | |
| | | |

ADD CUSTOM ATTRIBUTES — 780

CREATE   CANCEL

DEVICE DASHBOARD 1500

| DEVICE ID 1510 | DEVICE NAME 1520 | DEVICE DATA 1530 | LAST READING 1540 | BATTERY LIFE 1550 |
|---|---|---|---|---|
| TS120 | DEVICE A | 70 | 2/12/04 10:23AM | ||||||||||||||||||| |
| TS140 | DEVICE B | 40 | 1/24/06 9:15PM | ||||||||||||||||||| |
| M101 | DEVICE C | 36 | 1/24/09 9:15PM | ||||||||||||||||||| |
| AS130 | DEVICE D | 43 | 1/26/06 10:21AM | ||||||||||||||||||| |
| M104 | DEVICE E | 45 | 1/24/06 9:15PM | ||||||||||||||||||| |
| TS155 | DEVICE F | 65 | 1/24/06 9:15PM | ||||||||||||||||||| |
| TS143 | DEVICE G | 65 | 1/24/06 9:15PM | ||||||||||||||||||| |
| TS122 | DEVICE H | 7 | 12/23/05 7:12AM | ||||||||||||||||||| |
| TS670 | DEVICE I | 82 | 1/24/06 9:15PM | ||||||||||||||||||| |
| TS890 | DEVICE J | 81 | 1/24/06 9:15PM | ||||||||||||||||||| |

METHOD, SYSTEM AND GRAPHICAL USER INTERFACE FOR CONFIGURING A SIMULATOR TO SIMULATE A PLURALITY OF DEVICES

RELATED APPLICATIONS

The present application is related to U.S. patent application Ser. No. 12/212,555, filed Sep. 17, 2008, entitled "METHOD AND SYSTEM FOR SIMULATING A PLURALITY OF DEVICES," naming Michael Biltz, Jonathan Hsu, Sean Stauth, and Graeme MacDonald as inventors, assigned to the assignee of the present invention. That application is incorporated herein by reference in its entirety and for all purposes.

BACKGROUND OF THE INVENTION

Simulation is often used to monitor, debug or otherwise analyze a system or device. For example, a component designed to access an analog signal output by a sensor may be tested using a sensor simulator. The sensor simulator may be coupled to the component or device under test, where a simulated signal voltage may be accessed by the device under test for analysis thereof.

One type of conventional sensor simulator that is commercially available provides for single-sensor simulation. In other words, the software and/or hardware only provides a simulated output for a single sensor, and therefore, is not scalable. Additionally, conventional sensor simulators simulate the signal characteristics of a signal output by a sensor, e.g., a voltage level, etc. Therefore, conventional sensor simulators do not provide for good simulation of a sensor designed to output digital data in packetized formats.

Although systems with few devices may be analyzed using conventional simulators, conventional simulators are not suitable for analyzing systems with a large number of devices. For example, systems for monitoring or tracking data from automobiles, other vehicles, manufacturing sensors, or the like, often involve thousands or even millions of devices.

Accordingly, many instances of a conventional, single-device simulator would have to be individually created and configured to enable simulation of the numerous devices, thereby providing a costly and inefficient solution. Additionally, even if such a solution were implemented, the large amount of information output by the individual simulators would require extensive and costly processing resources. Moreover, given that conventional simulators output a simulated signal voltage which must be converted or otherwise processed to produce usable data, the amount of processing resources is further increased and the existing problems are exacerbated.

SUMMARY OF THE INVENTION

Accordingly, a need exists for a simulator which enables a user to more easily and efficiently define a large number of devices for simulation. A need also exists for a simulator which enables a user to more easily and efficiently configure the defined devices, ether individually or in groups. Further, a need exists for such a simulator which generates simulated device data that is easier and less costly to process. Embodiments of the present invention provide novel solutions to these needs and others as described below.

Embodiments of the present invention are directed to a method, system and graphical user interface for configuring a simulator. More specifically, a graphical user interface may be used to define a configurable device profile, where a large number of devices for simulation by a simulator may be created based upon the configurable device profile. Once created, the devices may be individually configured and/or configured in groups. Additionally, the configuration of the devices (e.g., defined by one or more attributes specified in the device profile configuration and/or device configuration) may determine how the simulator generates and/or outputs simulated device data for the devices. For example, an attribute may be associated with a device which defines a format of the simulated device data, a rate at which the simulated device data is output, a range of values for the simulated device data, or an operating parameter of the device. An attribute specifying the communicative coupling of the devices (e.g., a relationship of one device with respect to other coupled devices) may also be defined. Further, the simulated device data may include a data value (e.g., as opposed to a simulated voltage level) in one embodiment.

In one embodiment, a method of configuring a simulator includes generating a graphical user interface for display on a computer system, the graphical user interface for enabling a user to define at least one attribute associated with a device profile, the graphical user interface further for enabling a user to define a plurality of devices for instantiation by the simulator based on the device profile, the graphical user interface further for enabling a user to define a quantity of the plurality of devices for instantiation by the simulator, wherein the plurality of devices are associated with the at least one attribute. Configuration data for configuring the simulator is generated based upon user interaction with the graphical user interface. The configuration data is stored for access by the simulator during a simulation of the plurality of devices, wherein the simulator is operable to generate simulated device data for the plurality of devices in accordance with the configuration data, and wherein the simulated device data is for use in analyzing performance of a component coupled to receive the simulated device data. The at least one attribute may be selected from a group consisting of a format of the simulated device data, a rate at which the simulated device data is output by the simulator, a range of values for the simulated device data, and an operating parameter of at least one of the plurality of devices for inclusion in the simulated device data.

In another embodiment, an on-screen graphical user interface for configuring a simulator includes a first display region for enabling a user to define at least one attribute associated with a device profile. The graphical user interface also includes a second display region for enabling a user to define a plurality of devices for instantiation by the simulator based on the device profile, wherein the second display region is further for enabling a user to define a quantity of the plurality of devices for instantiation by the simulator, wherein the plurality of devices are associated with the at least one attribute. Configuration data generated based upon user interaction with the first and second display regions are for configuring the simulator to simulate the plurality of devices, wherein the simulator is operable to generate simulated device data for the plurality of devices in accordance with the configuration data, and wherein the simulated device data is for use in analyzing a component coupled to the simulator. The graphical user interface may also include a third display region for enabling a user to define a customized attribute for at least one device of the plurality of devices, wherein the customized attribute is unique to the at least one device, and wherein the customized attribute is for generating the configuration data for the at least one device. A fourth display region may enable a user to define a communicative coupling of the plurality of devices, and wherein the communicative coupling of the plurality of devices is for generating the configuration data for the plurality of devices.

BRIEF DESCRIPTION OF THE DRAWINGS

The present invention is illustrated by way of example, and not by way of limitation, in the figures of the accompanying drawings and in which like reference numerals refer to similar elements.

FIG. 7 shows an exemplary on-screen computer-implemented graphical user interface for defining a device profile in accordance with one embodiment of the present invention.

FIG. 15 shows an exemplary on-screen computer-implemented graphical user interface for presenting data associated with a simulation of a plurality of devices in accordance with one embodiment of the present invention.

DETAILED DESCRIPTION OF THE INVENTION

Figure 1:
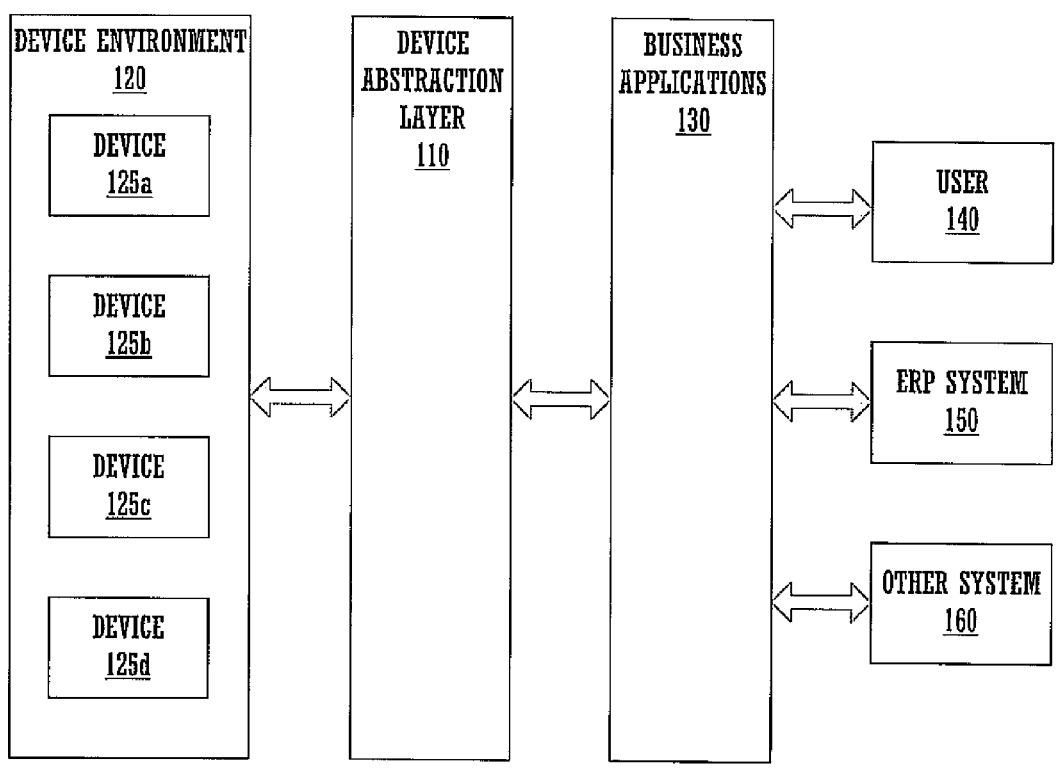
FIG. 1 shows an exemplary system for accessing and processing data from physical devices in accordance with one embodiment of the present invention.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Notation and Nomenclature

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "aborting," "accepting," "accessing," "adding," "adjusting," "analyzing," "applying," "assembling," "assigning," "balancing," "blocking," "calculating," "capturing," "combining," "comparing," "collecting," "configuring," "creating," "debugging," "defining," "delivering," "depicting," "detecting," "determining," "displaying," "establishing," "executing," "forwarding," "flipping," "generating," "grouping," "hiding," "identifying," "initiating," "instantiating," "interacting," "modifying," "monitoring," "moving," "outputting," "performing," "placing," "presenting," "processing," "programming," "querying," "removing," "repeating," "resuming," "sampling," "simulating," "sorting," "storing," "subtracting," "suspending," "tracking," "transcoding," "transforming," "unblocking," "using," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Overview of the Simulation Platform

FIG. 1 shows exemplary system 100 for accessing and processing data from physical devices, e.g., sensor devices, in accordance with one embodiment of the present invention. The sensor devices may be remote and distributed in large numbers. Within system 100, the devices may also receive and respond to commands. As shown in FIG. 1, device abstraction layer 110 enables communication between device environment 120 and business applications 130, where device environment 120 includes actual or physical devices 125a-125d. For example, device data generated by one or more of devices 125a-125d may be communicated to business applications 130 via device abstraction layer 110. The communicated data, or information associated therewith, may be accessed by end user 140, enterprise resource planning (ERP) system 150, other system 160, or some combination thereof, each of which are coupled to business applications 130 as shown in FIG. 1. In other embodiments, data may be alternatively communicated within system 100 (e.g., data input or generated by user 140, ERP system 150, or other system 160 may be communicated to one or more of devices 125a-125d, etc.).

In one embodiment, system 100 may enable monitoring or tracking of data generated by devices 125a-125d. For example, devices 125a-125d may be sensors, embedded devices, portable electronic devices, or components (e.g., each within a different portion of a manufacturing line, an automobile, etc.) which measure parameters of device environment 120 (e.g., the manufacturing line, automobile, etc.). The devices (e.g., 125a-125d) may output device data based upon those measurements. The device data may be accessed and/or processed by business applications 130 (e.g., accessed via device abstraction layer 110) to enable tracking or monitoring of the device environment (e.g., 120) by a user (e.g., 140) and/or another system (e.g., ERP system 150, other system 160, etc.).

Although only four devices (e.g., 125a-125d) are shown within device environment 120 in FIG. 1, it should be appreciated that device environment 120 may include any number of devices in other embodiments. For example, system 100 may enable communication with a very large number (e.g., hundreds, thousands, millions, etc.) of devices, where the devices may be distributed remotely in one embodiment. Additionally, it should be appreciated that more than one device environment may be coupled to device abstraction layer 110 in other embodiments. For example, where device environment 120 represents a single automobile and system 100 is capable of accessing and/or processing data from millions of automobiles, then there may be a large number (e.g., millions, etc.) of device environments coupled to device abstraction layer 110 in other embodiments. Further, in one embodiment, device environment 120 may include devices (e.g., 125a-125d) which are physically separate from one another (e.g., each disposed in different automobiles which are thousands of miles apart). As another example, the sensors could be temperature sensors distributed over a large building, where the sensors may be in communication with a fire system, etc.

Figure 2:
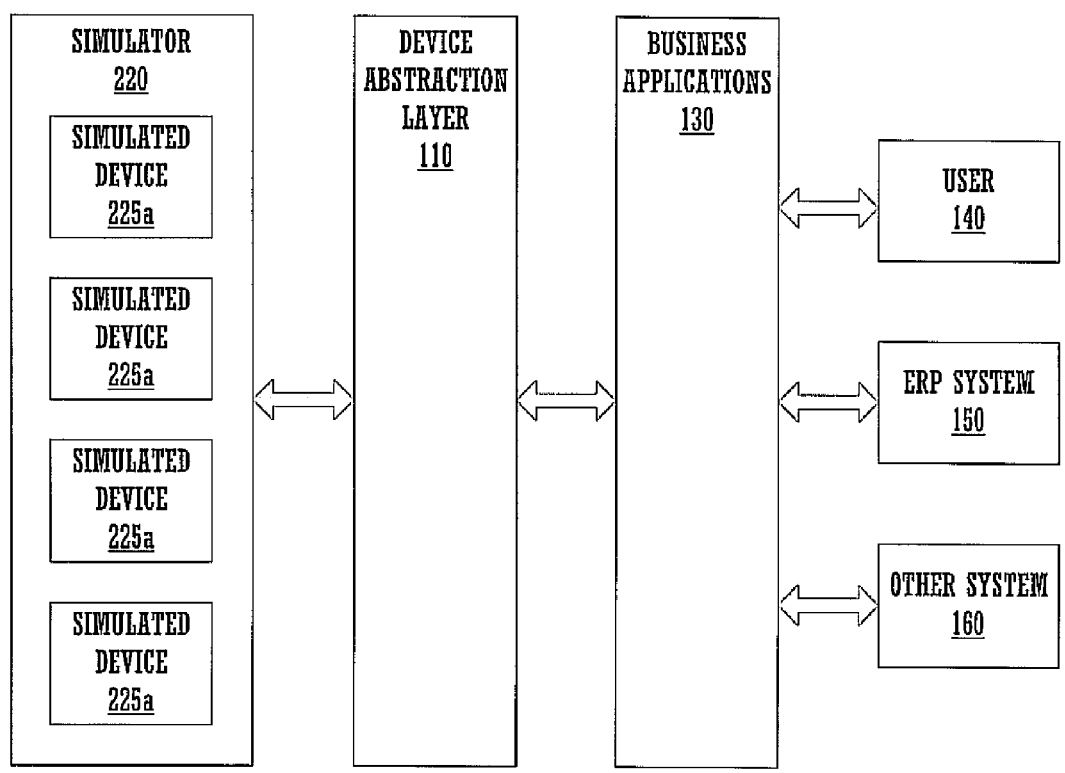
FIG. 2 shows an exemplary system for simulating a plurality of devices in accordance with one embodiment of the present invention.

As shown more fully in FIG. 2, embodiments of the present invention provide for simulation of the physical devices for performance testing of device abstraction layer 110 and/or business applications 130. Embodiments also provide for an efficient mechanism for generating devices for simulation.

FIG. 2 shows exemplary system 200 for simulating a plurality of devices in accordance with one embodiment of the present invention. As shown in FIG. 2, simulator 220 may be configured to simulate the responses, outputs, behavior, etc., of devices 225a-225d (e.g., corresponding to devices 125a-125d of FIG. 1). Simulated devices 225a-225d may be simulated sensors, simulated embedded devices, simulated portable electronic devices, other types of simulated devices, or some combination thereof. In one embodiment, any device capable of receiving commands and generating output may be simulated.

During simulation of the devices (e.g., 225a-225d), simulator 220 may output simulated device data for the devices (e.g., 225a-225d), where the simulated device data may represent a data value (e.g., a temperature in degrees Fahrenheit) instead of a signal voltage level (e.g., 1.25 volts) in one embodiment. The simulated device data may be accessed (e.g., via device abstraction layer 110) and/or processed similar to the device data output by devices 125a-125d as explained with respect to FIG. 1.

It is appreciated that simulator 220 may be used to perform load testing or otherwise analyze the performance of a component of a system under test (e.g., components of device abstraction layer 110, components of business applications 130, etc.). The analysis may be based upon a result of the component's processing of the simulated device data (e.g., output by simulator 220 for devices 225a-225d). Additionally, such analysis may be advantageously performed without deploying actual hardware (e.g., devices 125a-125d) in one embodiment.

Figure 3:
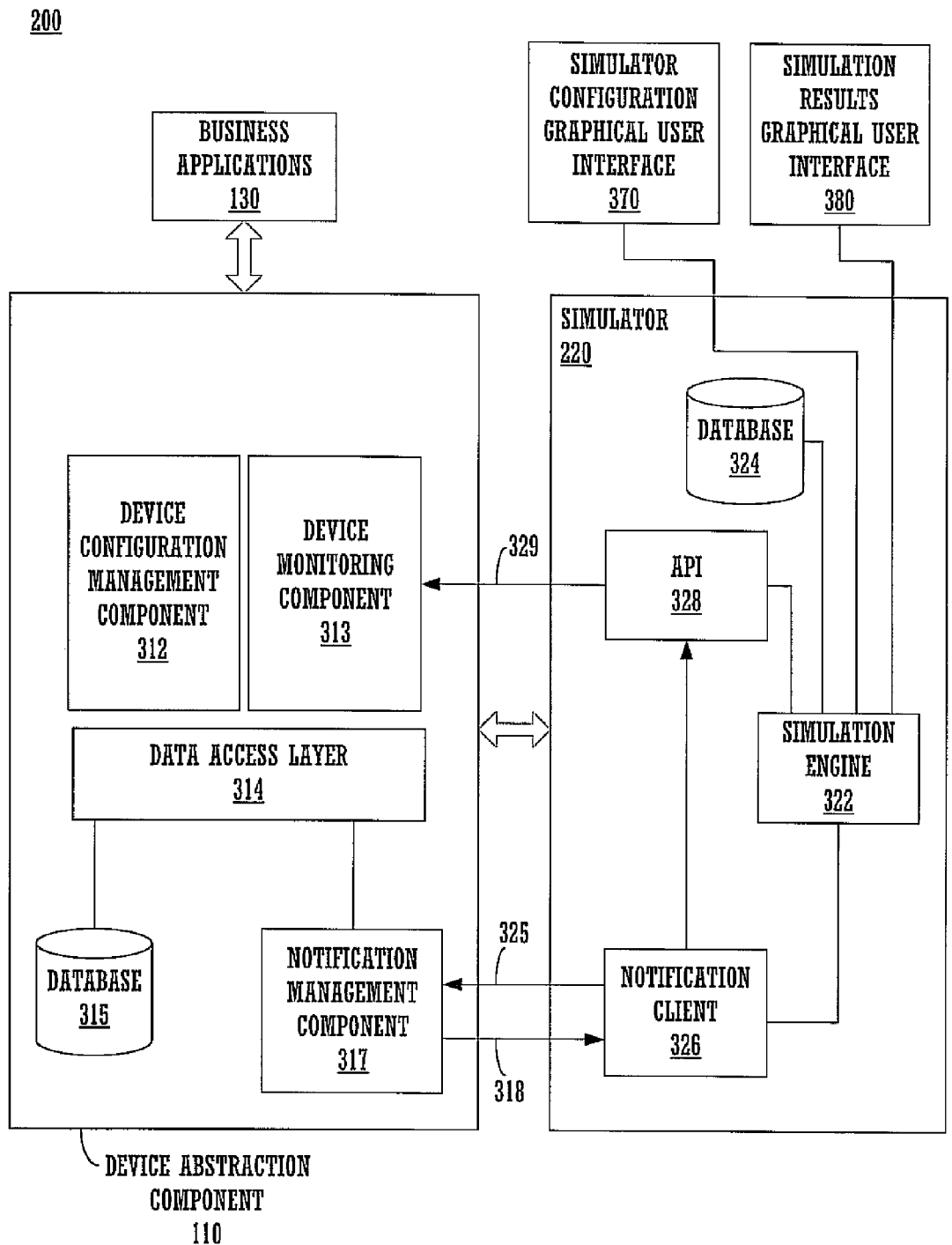
FIG. 3 shows an exemplary system for configuring a simulator and simulating a plurality of devices based upon a specified configuration in accordance with one embodiment of the present invention.
Figure 4A:
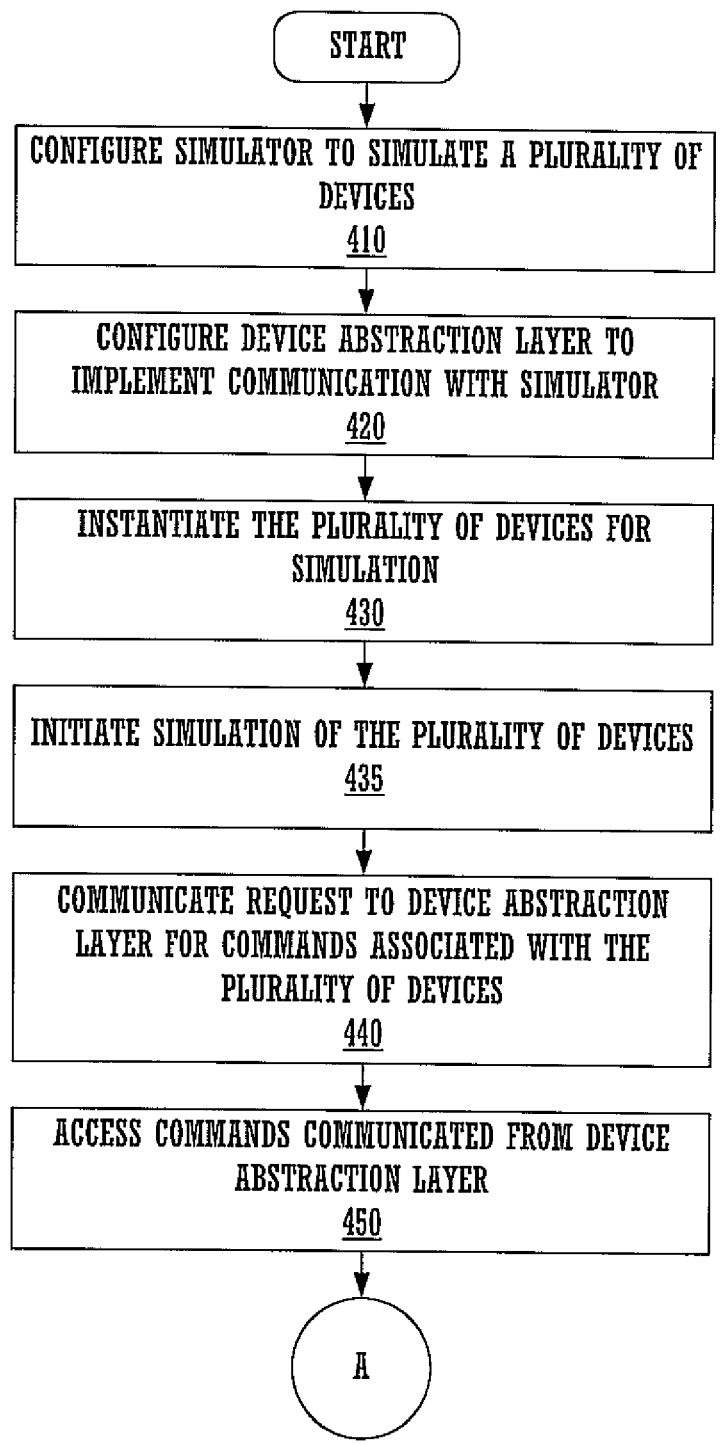
FIG. 4A shows a first portion of a flowchart of an exemplary computer-implemented process for configuring a simulator and simulating a plurality of devices based upon a specified configuration in accordance with one embodiment of the present invention.
Figure 4B:
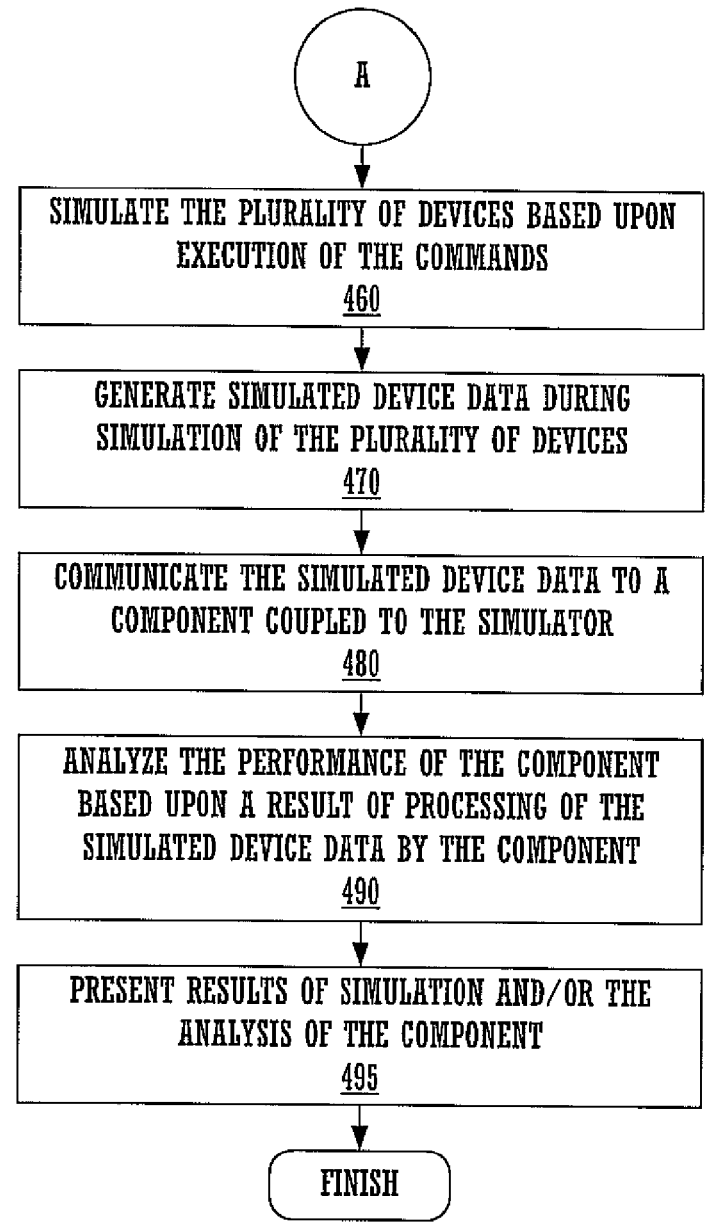
FIG. 4B shows a second portion of a flowchart of an exemplary computer-implemented process for configuring a simulator and simulating a plurality of devices based upon a specified configuration in accordance with one embodiment of the present invention.

FIG. 3 shows exemplary system 200 for configuring a simulator and simulating a plurality of devices based upon a specified configuration in accordance with one embodiment of the present invention. FIG. 3 will be described in conjunction with FIGS. 4A and 4B, where FIGS. 4A and 4B show a flowchart of exemplary computer-implemented process 400 for configuring a simulator and simulating a plurality of devices based upon a specified configuration in accordance with one embodiment of the present invention.

Step 410 involves configuring a simulator to simulate a plurality of devices. As shown in FIG. 3, simulator configuration graphical user interface (GUI) 370 is coupled to simulator 220 for configuration thereof. More specifically, configuration data generated based upon user interaction with GUI 370 (e.g., implemented in accordance with one or more of FIGS. 6-14) may be accessed by simulation engine 322 and stored in database 324 (e.g., for access by simulation engine 322 during simulation of devices 225a-225d). The configuration data may be generated based upon one or more attributes defined for a device profile (e.g., using GUI 370) and/or for one or more devices automatically generated, e.g., instantiated, based upon the device profile (e.g., using GUI 370). The instantiated devices can be simulated. For example, the configuration data may include a format (e.g., integer, string, decimal, hex, etc.) of the simulated device data output by simulator 220, a rate at which simulated device data is output by simulator 220, a range of values for the simulated device data (e.g., a temperature range for output data of a simulated temperature sensor), an operating parameter (e.g., battery life) of one or more of the simulated devices, etc.

In one embodiment, step 410 may involve a user defining a device profile (e.g., using GUI 370) with prescribed attributes that define a type or class of devices. The user may also advantageously define a number of devices (e.g., 225a-225d)

to be automatically generated (e.g., using GUI 370) based upon the device profile. The devices may be configured individually and/or in groups. Additionally, the communicative coupling of the devices may be defined in step 410 in one embodiment. Further, device configuration data may be generated and/or stored in step 410 based upon the user interaction with the GUI (e.g., 370) for defining the device profile and/or devices (e.g., generated automatically based upon the device profile).

Step 420 of process 400 involves configuring a device abstraction layer (e.g., 110) to implement communication with the simulator (e.g., 220). For example, device configuration management component 312 of device management component 311 may download the configuration data (e.g., generated in step 410) from simulator 220 and store it in database 315 of device abstraction layer 110. Data may be accessed by component 312 via data access layer 314 in one embodiment. Component 312 may configure device abstraction layer 110 based upon the downloaded configuration data (e.g., stored in database 315) to enable communication with simulator 220. For example, component 312 may determine a format, size, etc. (e.g., from the configuration data) of the simulated device data output from simulator 220, thereby enabling device abstraction layer 110 to access, process, communicate, etc., the simulated device data.

As shown in FIG. 4A, step 430 involves the simulator automatically instantiating the plurality of devices (e.g., 225a-225d) for simulation by the simulator. For example, individual memory constructs and/or data structures may be created and/or populated based upon device configuration data generated in step 410, thereby "instantiating" the devices for simulation. The created data structure for each device to be simulated includes the information required to simulate the device including device profile attributes and/or device state data. The data structure may include attributes associated with one device, a group of devices, a device profile (e.g., used to define a plurality of devices), or some combination thereof. The attributes may include a format for output of simulated device data, a rate at which the simulated device data is output by the simulator, a range of values for the simulated device data, an operating parameter of a device for inclusion in the simulated device data output by the device, current device state data, etc. And in one embodiment, the data structure may be a table organized into rows associated with different device types and columns associated with devices of each respective device type, and therefore, each cell of the table may include the attributes defined for the device associated with that cell and/or attributes defined for a device profile upon which the device is based. Further, although the instantiation of the plurality of devices is shown between steps 420 and 435 in FIG. 4, it should be appreciated that the instantiation of the plurality of devices may occur at any time after user-configuration of the devices and before simulation of the plurality of devices.

Step 435 involves initiating simulation of the plurality of instantiated devices (e.g., instantiated in step 430). In one embodiment, the simulation may be initiated in response to an interaction with a button or graphical object (e.g., 1080) of a GUI (e.g., 600 of FIG. 10) for configuring the simulator.

Step 440 involves communicating a request to a device abstraction layer for commands associated with the plurality of devices (e.g., 225a-225d). For example, notification client 326 of simulator 220 may communicate a request (e.g., 325) to notification management component 317 of device abstraction layer 110, where the request is for any commands associated with any of the simulated devices (e.g., 225a-225d).

As shown in FIG. 4A, step 450 involves the simulator accessing commands communicated from the device abstraction layer (e.g., 110). One or more commands 318 may be communicated to simulator 220 in response to the request (e.g., 325) received from a simulator (e.g., 220). The commands may include a request for simulated device data from one or more of the devices (e.g., 225a-225d), a request to change the frequency at which simulator 220 outputs the simulated device data for the devices (e.g., 225a-225d), a customized command for execution by one or more of the devices, or some combination thereof. Additionally, one or more received commands (e.g., 318) may be forwarded (e.g., represented by arrow 327 of FIG. 3) from a notification client (e.g., 326) to a device application programming interface (API) (e.g., 328) for execution in one embodiment. The commands may include identification information specifying an intended device for the command. It is appreciated that a command may also be specified for a class or grouping of devices as the case may be.

As shown in FIG. 4B, step 460 involves automatically and simultaneously simulating a plurality of instantiated devices (e.g., 225a-225d) based upon execution of the commands. For example, simulator 220 (e.g., simulation engine 322) may generate and/or output simulated device data in response to execution of a command for simulated output data, thereby simulating an output of device data from the plurality of devices. As another example, simulator 220 (e.g., simulation engine 322) may adjust an output frequency for simulated device data (e.g., a frequency at which the device automatically outputs data) for one or more of the devices in response to execution of a command to change the output frequency of simulated device data, thereby simulating a device responding to a configuration change affecting the frequency at which the device automatically outputs device data. And as a further example, simulator 220 (e.g., simulation engine 322) may perform a customized operation (e.g., not reporting simulated device data for a predetermined period of time for one or more devices, report simulated device data outside a predefined range to indicate the device has been placed in an alternate operating mode, etc.) in response to execution of a customized command, thereby simulating performance of a customized command or operation by the device.

Figure 10:
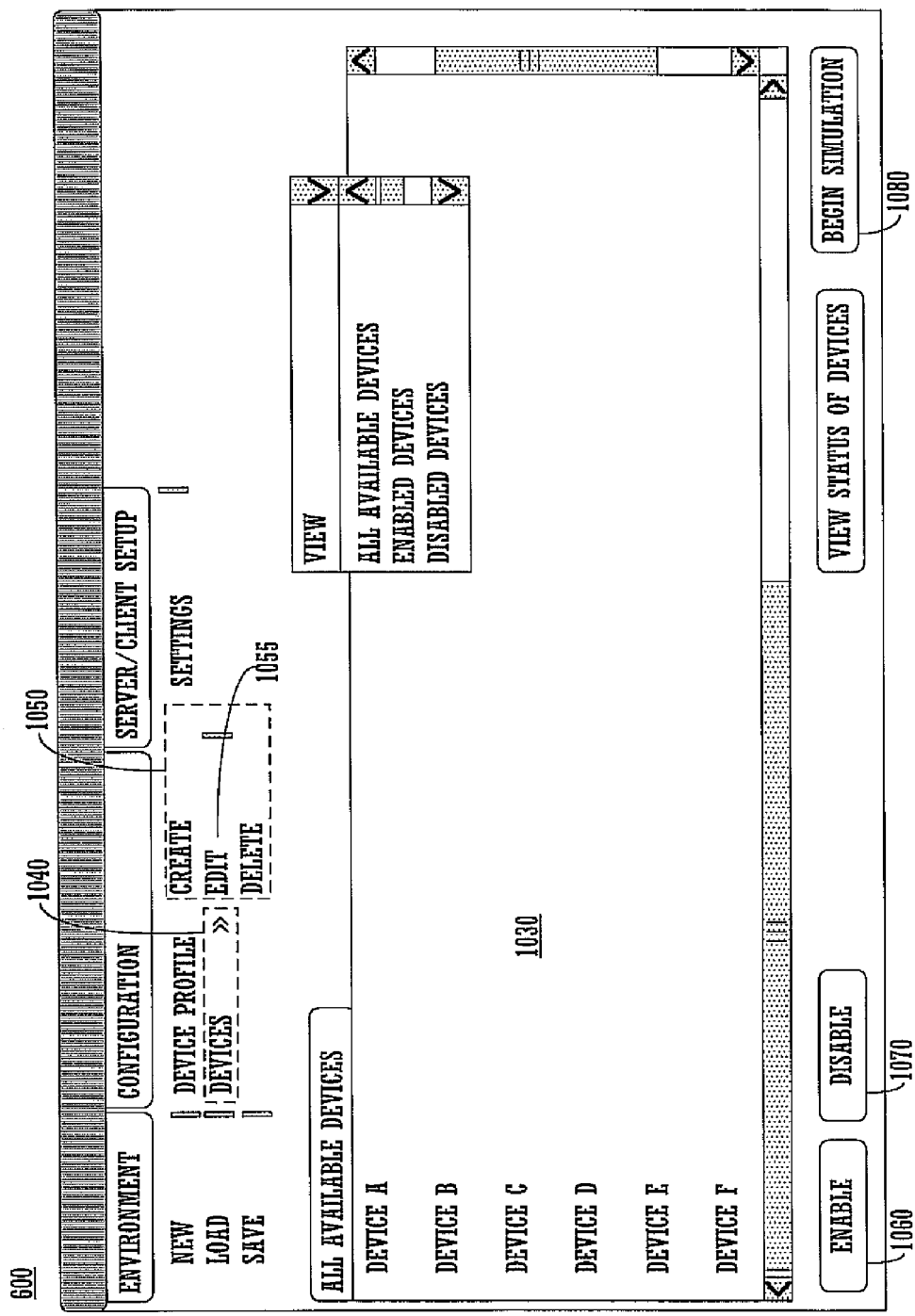
FIG. 10 shows an exemplary on-screen computer-implemented graphical user interface displaying a plurality of devices for simulation by a simulator in accordance with one embodiment of the present invention.

Simulation in step 460 may only be performed for "enabled" devices in one embodiment. For example, only commands associated with enabled devices (e.g., enabled using button or region 1060 of GUI 600 as shown in FIG. 10) may be executed in step 460. Commands for "disabled" devices (e.g., disabled using button or region 1070 of GUI 600 as shown in FIG. 10) may be ignored, and therefore, disabled devices may not be simulated in one embodiment.

Step 470 involves generating simulated device data during simulation of the plurality of devices (e.g., 225a-225d). As discussed herein, simulator 220 (e.g., simulation engine 322) may generate the simulated device data in response to a command (e.g., 318) from device abstraction layer 110 (e.g., notification management component 317). The simulated device data may be generated in accordance with configuration data (e.g., accessed from database 324), and therefore, the simulated device data may have a format, type, size, arrangement, content, etc., defined by the configuration data.

As shown in FIG. 4B, step 480 involves communicating the simulated device data to a component coupled to the simulator (e.g., 220). As discussed herein, simulator 220 (e.g., simulation engine 322) may output the simulated device data in response to a command (e.g., 318) from device abstraction layer 110 (e.g., notification management component 317). The simulated device data (e.g., 329) may be communicated to device monitoring component 313 of device abstraction layer 110 (e.g., via data access layer 314) in one embodiment, where component 313 may process the received simulated output data. And in one embodiment, the simulated device data may be communicated to a component of business applications 130 and/or another component coupled thereto.

Step 490 involves analyzing the performance of the component based upon a result of the processing of the simulated device data by the component (e.g., of device abstraction layer 110, of business applications 130, etc.). In this manner, the component accessing and/or processing the simulated device data may be load tested to determine or improve processing efficiency of the component, perform debugging operations on the component, or the like. As another example, the number of simulated devices, the arrangement of simulated devices, the format or other characteristics of the simulated device data output by the simulated devices, etc., may be varied to further test the component.

As shown in FIG. 4B, step 495 involves presenting the results of the simulation (e.g., performed in one or more of steps 430 to 470) and/or presenting the analysis of the component (e.g., generated in step 490). The data may be presented using a GUI (e.g., GUI 380 of FIG. 3) coupled to the simulator (e.g., 220). Additionally, in one embodiment, the GUI for presenting the data in step 495 may be implemented in accordance with GUI 1500 of FIG. 15.

Turning to FIG. 15, FIG. 15 shows exemplary on-screen computer-implemented GUI 1500 for presenting data associated with a simulation of a plurality of devices in accordance with one embodiment of the present invention. As shown in FIG. 15, GUI 1500 includes data in columns 1530-1550 associated with the devices listed in columns 1510 and 1520. For example, row 1560 is associated with the device (e.g., one of devices 225a-225d) identified by the device identifier in column 1510 of row 1560 (e.g., "TS120") and the device name in column 1520 of row 1560 (e.g., "Device A"). In one embodiment, the information listed in column 1510 for each device may be entered using region 1130 of GUI 1100, while the information listed in column 1520 may be entered using region 1140 of GUI 1100.

Column 1530 contains simulated device data for each of the devices identified in columns 1510 and 1520. For example, where each of the devices are simulated temperature sensors, the data listed in column 1530 may be temperature readings (e.g., in degrees Fahrenheit, in degrees Celsius, etc.). Each row of column 1540 may include the date and time at which a respective data value of column 1530 was captured or generated. Additionally, each row of column 1550 may include a battery status of a simulated device (e.g., identified in a respective row of column 1510 and/or 1520). The battery status in column 1550 may be captured or generated at a time identified in a respective row of column 1540 in one embodiment.

The data listed in one or more of columns 1530-1550 may be used to determine if a device is working correctly in one embodiment. For example, where a data range is specified for a plurality of devices (e.g., using region 1160 of GUI 1100), then a data value reported by the simulator (e.g., 220) and listed in column 1530 may indicate a problem with a device reporting a value outside of that range. For example, where a range of 40-90 is specified (e.g., using region 1160), then the data values in rows 1570 and 1580 of column 1530 may indicate that two devices (e.g., "Device C" of row 1570 and "Device H" of row 1580) are not operating properly since they are not within the range of 40-90. Similarly, unexpected data values reported in columns 1540 and/or 1550 may also indicate a problem with a sensor. In this manner, embodiments enable the simulation of faulty or inoperable devices, thereby improving the accuracy and/or realism of the simulation. The data from the faulty or inoperable devices may also enable the analysis of components which access this data, for example, as discussed with respect to step 490 of FIG. 4B.

In one embodiment, the reliability of the simulated devices may be altered (e.g., by configuring one or more devices using a GUI such as GUI 370, GUI 600, GUI 700, GUI 900, GUI 1100, GUI 1300, etc.) to simulate real-world device failure. In this manner, the simulator (e.g., 220) may simulate one or more faulty or inoperable devices, and therefore, cause one or more devices to report bad data (e.g., outside a predetermined range as discussed herein, etc.). For example, if a device is configured to have a 95% reliability factor or rate, then the device may report good data 95% of the time and report bad data the other 5% of the time.

Although FIG. 15 show the presentation of specific data, it should be appreciated that GUI 1500 may include other data related to a simulation of devices (e.g., 225a-225d) and/or analysis of a component accessing simulated device data (e.g., as discussed with respect to step 490 of FIG. 4B). Additionally, it should be appreciated that GUI 1500 may also enable a user to view past data transmissions (e.g., simulated device data generated in the past) of one or more simulated devices (e.g., 225a-225d).

Configuring the Simulator

Figure 5A:
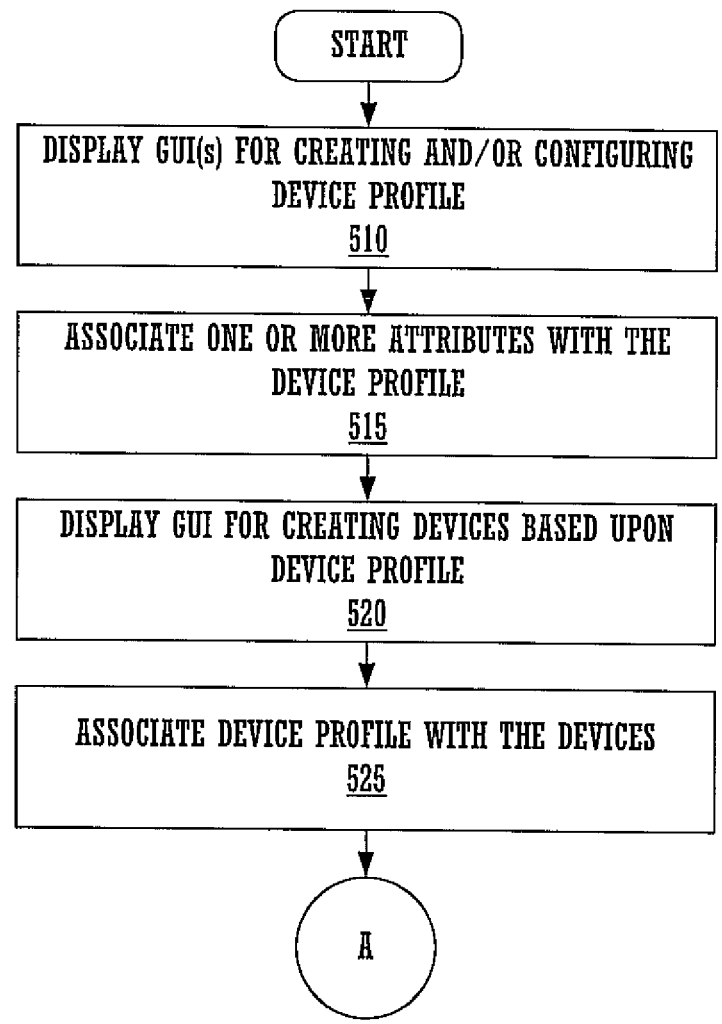
FIG. 5A shows a first portion of a flowchart of an exemplary computer-implemented process for configuring a simulator in accordance with one embodiment of the present invention.
Figure 5B:
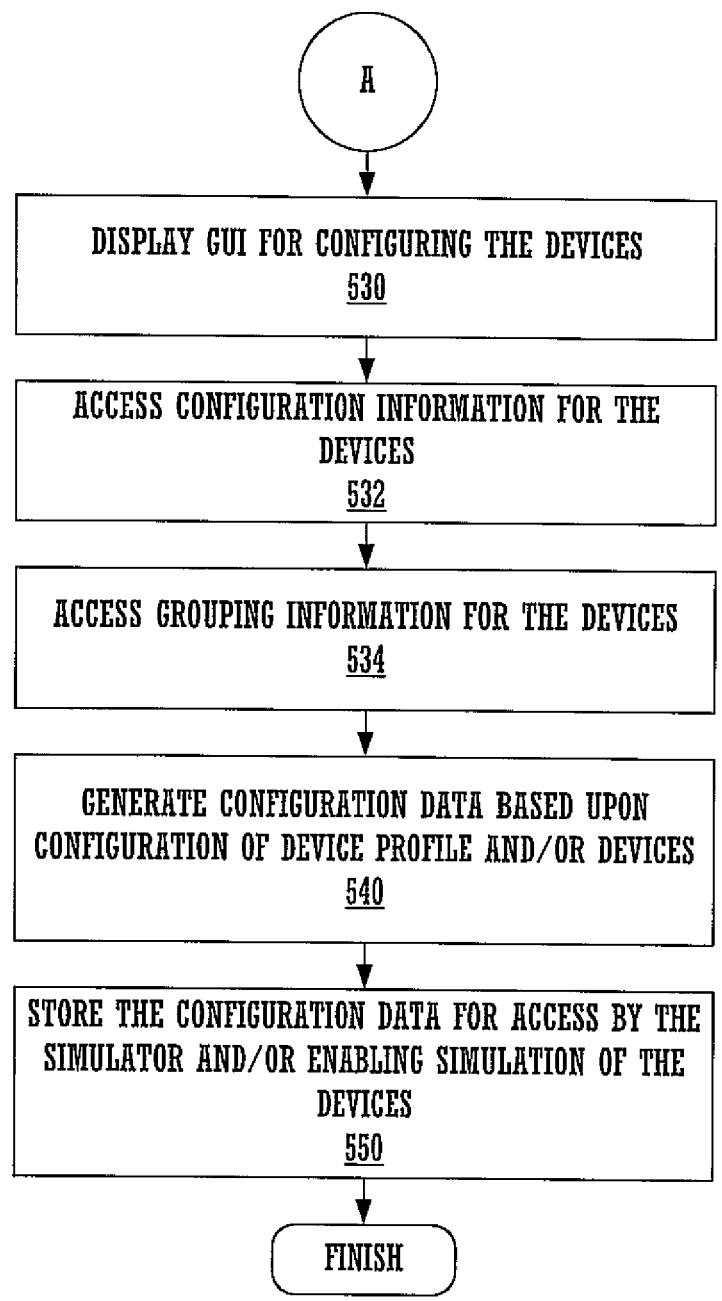
FIG. 5B shows a second portion of a flowchart of an exemplary computer-implemented process for configuring a simulator in accordance with one embodiment of the present invention.

FIGS. 5A and 5B show a flowchart of exemplary process 500 for configuring a simulator in accordance with one embodiment of the present invention. Process 500 may be used implement step 410 of process 400 of FIGS. 4A and 4B in one embodiment. Additionally, FIGS. 5A and 5B will be described in conjunction with FIGS. 6 through 14 which show exemplary GUIs for configuring a simulator in accordance with embodiments of the invention.

As shown in FIG. 5A, step 510 involves displaying one or more computer-implemented graphical user interfaces (GUIs) for creating and/or configuring a device profile. A device profile may be a template or collection of configurable attributes (e.g., defined by a user using the GUIs) which may be used to create a plurality of device (e.g., 225a-225d) in one embodiment. The one or more GUIs displayed in step 510 may be presented on a display device for interaction with a user, thereby enabling a user to create and/or configure a device profile. Additionally, the GUIs displayed in step 510 may be implemented in accordance with GUI 370 of FIG. 3, GUI 600 of FIG. 6, GUI 700 of FIG. 7, GUI 800 of FIG. 8, another GUI, some combination thereof, etc.

Figure 6:
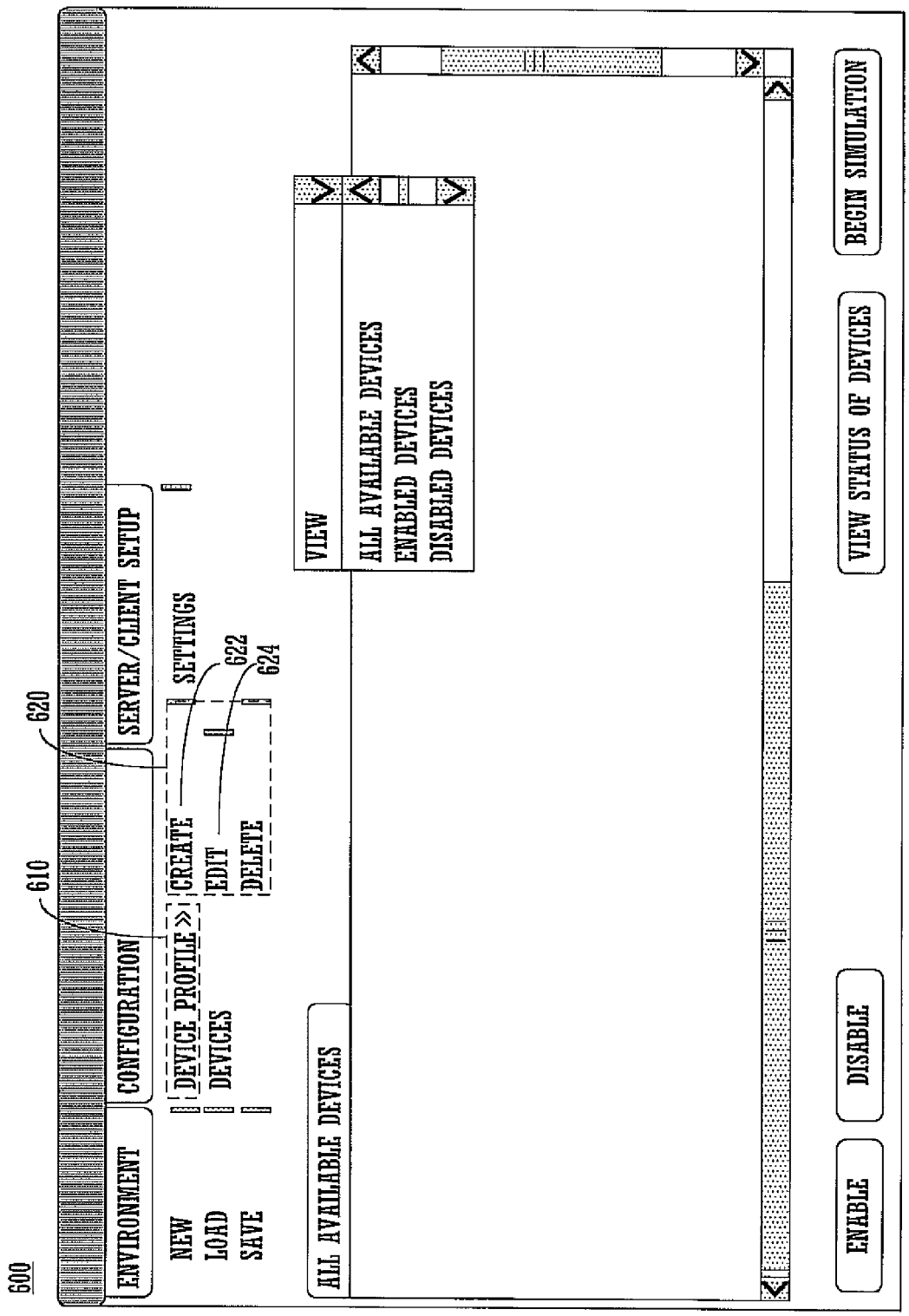
FIG. 6 shows an exemplary on-screen computer-implemented graphical user interface for configuring a simulator in accordance with one embodiment of the present invention.

FIG. 6 shows exemplary on-screen computer-implemented GUI 600 for configuring a simulator in accordance with one embodiment of the present invention. For example, as shown in FIG. 6, interaction with region 610 of GUI 600 may initiate display of region 620. Region 620 may be a pop-up menu with selectable menu items for creating, editing, and deleting a device profile. Interaction with a selectable menu item of region 620 (e.g., selectable menu item 622 for creating a device profile, selectable menu item 624 for editing an existing device profile, etc.) may initiate display of GUI 700 of FIG. 7 and/or GUI 800 of FIG. 8 in one embodiment.

FIG. 7 shows exemplary on-screen computer-implemented GUI 700 for defining a device profile in accordance with one embodiment of the present invention. GUI 700 may be used to create a new device profile in one embodiment. For example, display regions 710-730 may be used to specify information about the device profile, display regions 740-770 may be used define values for predetermined attributes, and display region 780 may be used to define new attributes (e.g., displayed in region 785). Alternatively, GUI 700 may be used to edit an existing device profile. For example, information entered into regions 710-730 may be edited and/or values for predetermined attributes may be re-defined using regions 740-770. Additionally, a user may edit an existing device profile by interacting with region 780 to re-define an existing custom attribute (e.g., displayed in region 785) and/or define new custom attributes (e.g., which may then be displayed in region 785).

As shown in FIG. 7, regions 710-730 may be used to enter information for the device profile. For example, region 710 may be used to enter an identifier (e.g., "28") for the device profile, where the profile identification number may distinguish device profiles (e.g., of the same device profile type) with different attributes from one another. A profile type (e.g., "sensor") for the device profile may be defined using region 720. For example, if the device profile is associated with a sensor using region 720, then the devices created from the device profile may be simulated sensors in one embodiment. Additionally, region 730 may be used to enter a name for the device profile, where the profile name may distinguish device profiles (e.g., of the same device profile type) with different attributes from one another.

Regions 740-770 may be used to define values for predetermined attributes. For example, region 740 may be used to define a profile data range. The profile data range may be an expected range associated with the simulated output data output by a simulator (e.g., 220) for a plurality of devices (e.g., 225a-225d). Additionally, the simulator (e.g., 220) may access the data range entered into region 740 and generate simulated device data for one or more simulated devices (e.g., 225a-225d) which falls within the range entered into region 740.

Region 750 may be used to define a frequency for generating or outputting simulated device data for the plurality of devices. For example, if a value of "2" is entered into region 750, then the simulator (e.g., 220) may output simulated device data for a simulated device (e.g., created based upon the device profile defined using GUI 700) every 2 minutes (e.g., where the unit of frequency associated with region 750 is minutes).

As shown in FIG. 7, a battery life may be defined for the devices using region 760. For example, if a value of "2" is entered into region 760, then a battery life of 2 days (e.g., where the unit of battery life associated with region 760 is days) may be associated with a device created based upon the device profile defined using GUI 600.

Region 770 may be used to define a format for the simulated device data output for simulated devices (e.g., 220a-220d) created based upon a device profile defined using GUI 600. In one embodiment, the format may correspond to how the simulated device data for the plurality of devices (e.g., created based upon the device profile defined using GUI 700) is assembled. Additionally, a format defined using region 770 may include decimal, integer, string, hex, another format, etc.

Figure 8:
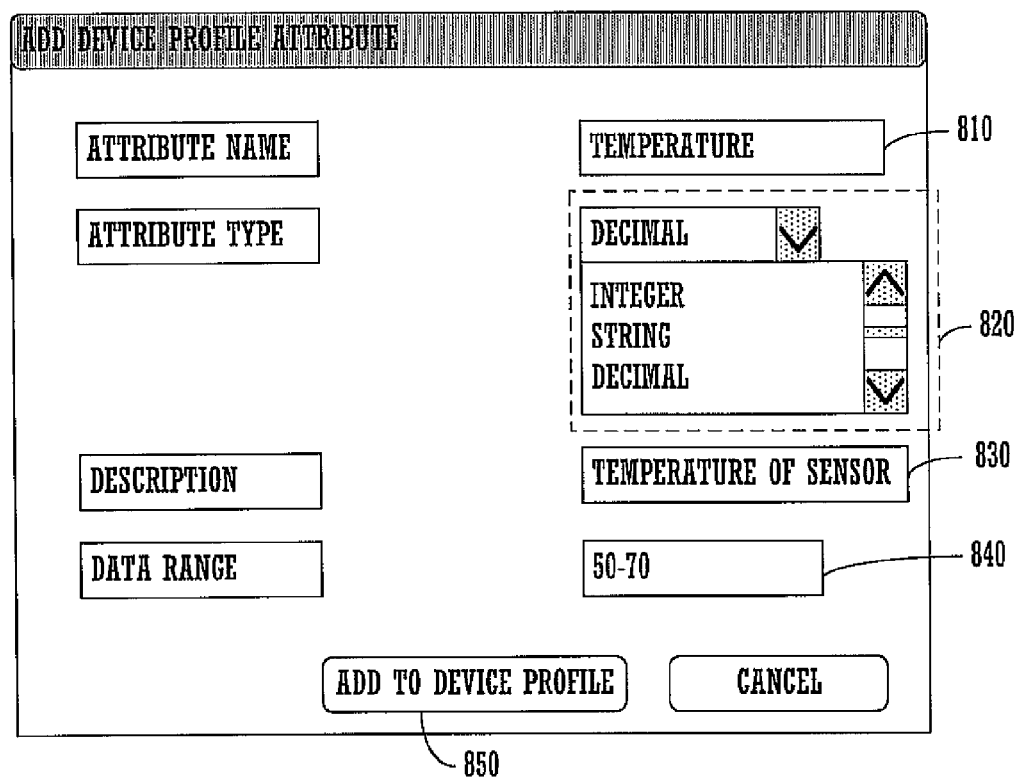
FIG. 8 shows an exemplary on-screen computer-implemented graphical user interface for defining a custom attribute in accordance with one embodiment of the present invention.

Interaction with button or region 780 may initiate display of GUI 800 of FIG. 8 in one embodiment, where FIG. 8 shows exemplary on-screen computer-implemented GUI 800 for defining a custom attribute in accordance with one embodiment of the present invention. Region 810 may be used to define a name for the custom attribute, region 820 may be used to define an attribute type for the custom attribute (e.g., how the custom attribute will be expressed in the simulated device data), region 830 may be used to specify a description of the custom attribute, and region 840 may be used to define a data range for the simulated device data corresponding to the custom attribute (e.g., similar to the predefined attribute data range defined using region 740 of FIG. 7). Additionally, interaction with button or region 850 may associate the information defined in regions 810-840 with the device profile (e.g., defined using GUI 700) and present the information in region 785 of GUI 700.

Turning back to FIG. 5A, step 515 involves associating one or more attributes with the device profile (e.g., crated using GUI 700 and/or GUI 800). The one or more attributes may be predefined attributes (e.g., associated with regions 740-770) and/or custom attributes (e.g., defined using GUI 800 and presented in region 785). Additionally, the one or more attributes may be associated with the device profile in response to interaction with button or region 790 in one embodiment.

Step 520 involves displaying a GUI for creating devices (e.g., to be simulated) based upon the device profile (e.g., created using GUI 700, GUI 800, etc.). The one or more GUIs displayed in step 520 may be presented on a display device for interaction with a user, thereby enabling a user to create a device for simulation by a simulator (e.g., 220). Additionally, the GUI displayed in step 520 may be implemented in accordance with GUI 370 of FIG. 3, GUI 600 of FIG. 6, GUI 900 of FIG. 9, etc.

Figure 9:
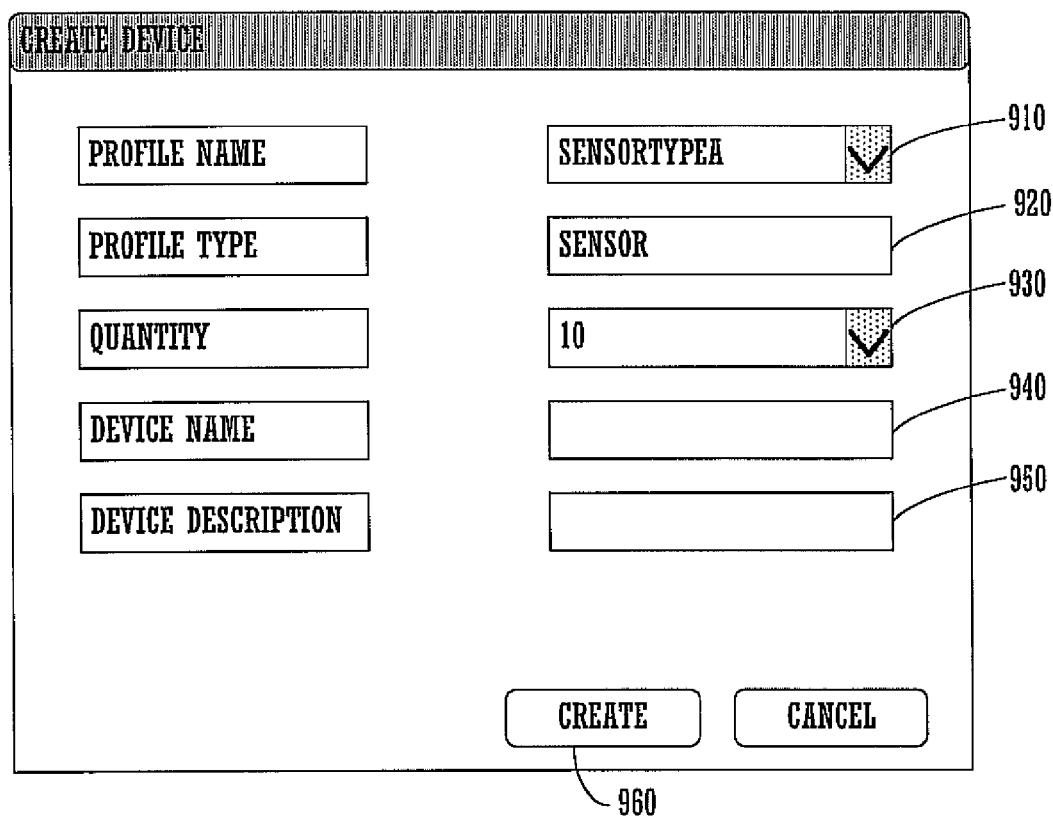
FIG. 9 shows an exemplary on-screen computer-implemented graphical user interface for creating a device based upon a device profile in accordance with one embodiment of the present invention.

FIG. 9 shows exemplary on-screen computer-implemented GUI 900 for creating a device based upon a device profile in accordance with one embodiment of the present invention. As shown in FIG. 9, region 910 may be used to specify a device profile (e.g., created using GUI 600) upon which simulated devices are to be created. Region 920 may indicate a type of profile selected or defined using region 910. Region 930 may be used to specify a number of devices to be created based upon the device profile (e.g., selected using region 910). In this manner, embodiments of the present invention enable users to easily create a plurality of devices (e.g., for simulation by a simulator) based upon a selected device profile, where the created devices may be instantiated based upon information entered into GUI 900 (e.g., as discussed with respect to step 430 of FIG. 4A) and simulated (e.g., as discussed with respect to one or more of steps 435 to 480 of FIGS. 4A and 4B).

Region 940 may enable a user to specify a name or root identifier for one or more of the devices created based upon the selected device profile. Additionally, a description of the one or more devices may be entered in region 950.

Turning back to FIG. 5A, step 525 involves associating the device profile with the devices. For example, interaction with button or region 960 of GUI 900 may associate the device profile (e.g., selected using region 910) with one or more devices (e.g., a number of devices specified in region 930). Once created, the devices may be displayed in region 1030 of GUI 600 (e.g., as shown in FIG. 10).

FIG. 10 shows exemplary on-screen computer-implemented GUI 600 displaying a plurality of devices for simulation by a simulator in accordance with one embodiment of the present invention. As shown in FIG. 10, region 1030 may present one or more of the created devices (e.g., using GUI 900 based upon a profile defined using GUI 600). The created devices may be further configured or edited by interaction with region 1055, where region 1055 may initiate display of GUI 1100 of FIG. 11 in one embodiment. Further, in one embodiment, region 1050 (e.g., including region 1055) may be displayed in response to interaction with region 1040.

Turning to FIG. 5B, step 530 involves displaying a GUI for configuring the devices (e.g., created using GUI 900). The one or more GUIs displayed in step 530 may be presented on a display device for interaction with a user, thereby enabling a user to further configure a device for simulation by a simulator (e.g., 220). Additionally, the GUI displayed in step 530 may be implemented in accordance with GUI 370 of FIG. 3, GUI 1100 of FIG. 11, etc.

Figure 11:
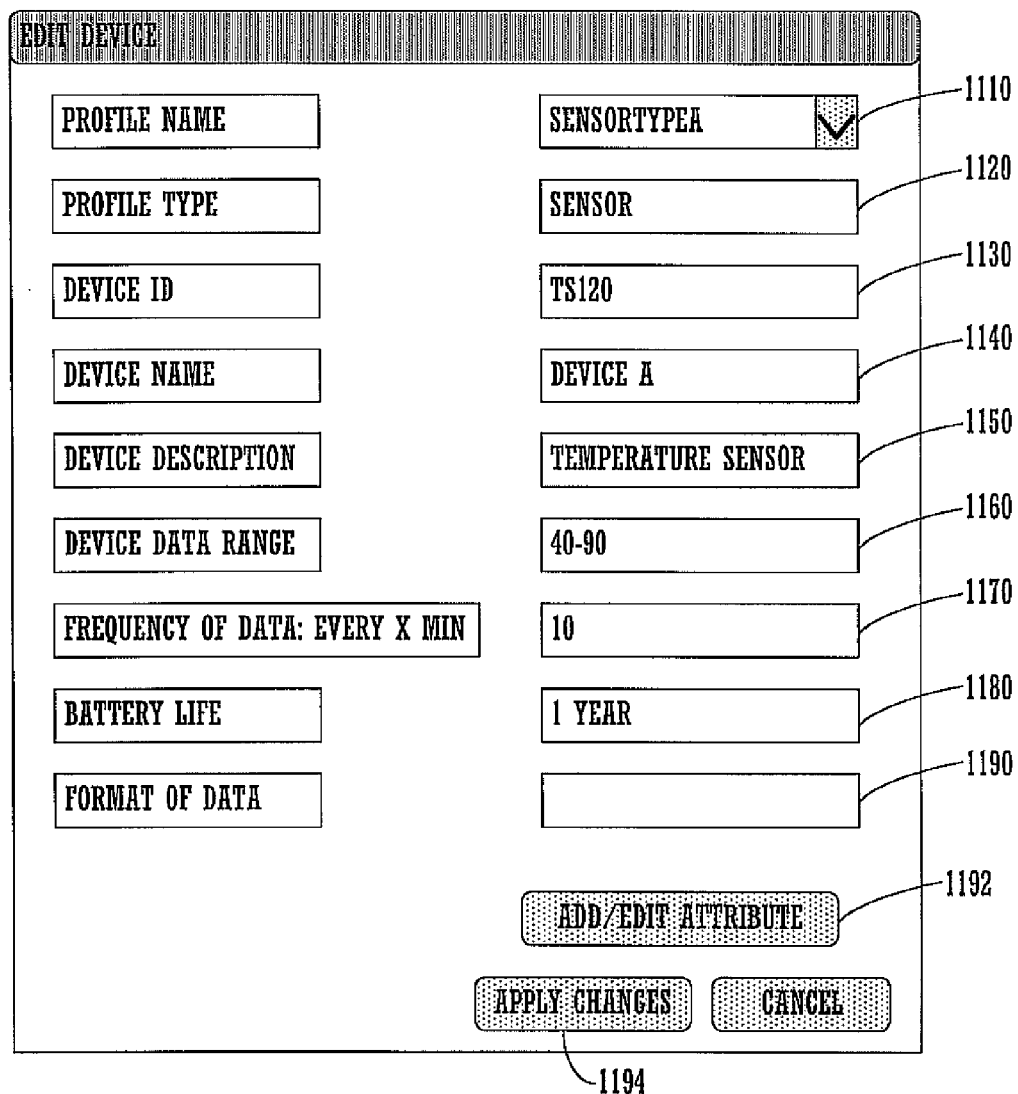
FIG. 11 shows an exemplary on-screen computer-implemented graphical user interface for configuring a created device in accordance with one embodiment of the present invention.

FIG. 11 shows exemplary on-screen computer-implemented GUI 1100 for configuring a created device in accordance with one embodiment of the present invention. As shown in FIG. 11, region 1110 may be used to change or define a profile name (e.g., similar to region 910 of FIG. 9). Region 1120 may be used to change or define a profile type (e.g., similar to region 920 of FIG. 9). Region 1130 may be used to change or define a device identifier (e.g., assigned automatically upon creation of multiple devices using GUI 900).

Region 1140 may be used to change or define a device name (e.g., similar to region 940 of FIG. 9). In one embodiment, the device name displayed in region 1140 may be automatically assigned upon creation of multiple devices using GUI 900. Additionally, region 1150 may be used to change or define a device description (e.g., similar to region 950 of FIG. 9). In one embodiment, the device description displayed in region 1150 may be automatically assigned upon creation of multiple devices using GUI 900.

As shown in FIG. 11, region 1160 may be used to change or define a device data range (e.g., similar to region 740 of FIG. 7). Region 1170 may be used to change or define a frequency for generating or outputting simulated device data for the plurality of devices (e.g., similar to region 750 of FIG. 7). Additionally, a battery life may be defined for the devices using region 1180 (e.g., similar to region 760 of FIG. 7). Region 1190 may be used to define a format for simulated device data (e.g., similar to region 770).

Interaction with button or region 1192 may enable a user to define a custom attribute (e.g., similar to button or region 780 of FIG. 7), where the interaction with region 1192 may initiate display of GUI 800 of FIG. 8 in one embodiment. Additionally, interaction with button or region 1194 may apply the changes made to the device using GUI 1100 and/or initiate display of GUI 600 (e.g., of FIG. 6, FIG. 10, etc.).

As shown in FIG. 10, a device (e.g., presented in region 1030) may be enabled for inclusion in a group of devices to be simulated using button or region 1060. Alternatively, an enabled device (e.g., presented in region 1030) may be disabled for removing the device from a group of devices to be simulated, where the device may be disabled using button or region 1070.

Turning back to FIG. 5B, step 532 involves accessing configuration information for the devices. The configuration information accessed in step 532 may be based upon information entered using GUI 600, GUI 700, GUI 800, or some combination thereof. In one embodiment, the configuration information may include information entered using GUI 900 and/or GUI 1100.

Step 534 involves accessing grouping information defined for the devices. The grouping information accessed in step 534 may include information about a number of groups into which devices (e.g., those created using GUI 900) are organized, a name of each device grouping, a listing of specific devices in each group, and the like. It is appreciated that the simulator may respond to a command given to a device group. Additionally, the grouping information may include configuration information defined for a group (e.g., a data range applied to all devices of a group, etc.). Information about a communicative coupling of the devices may also be included in the grouping information. For example, information about how the devices are arranged with respect to one another and/or the arrangement of communication channels or paths coupling the devices may be included in the grouping information accessed in step 534. Further, in one embodiment, the grouping information may be accessed based upon interaction with GUI 600 as shown in FIG. 12, GUI 1300 as shown in FIGS. 13 and/or 14, or the like.

Figure 12:
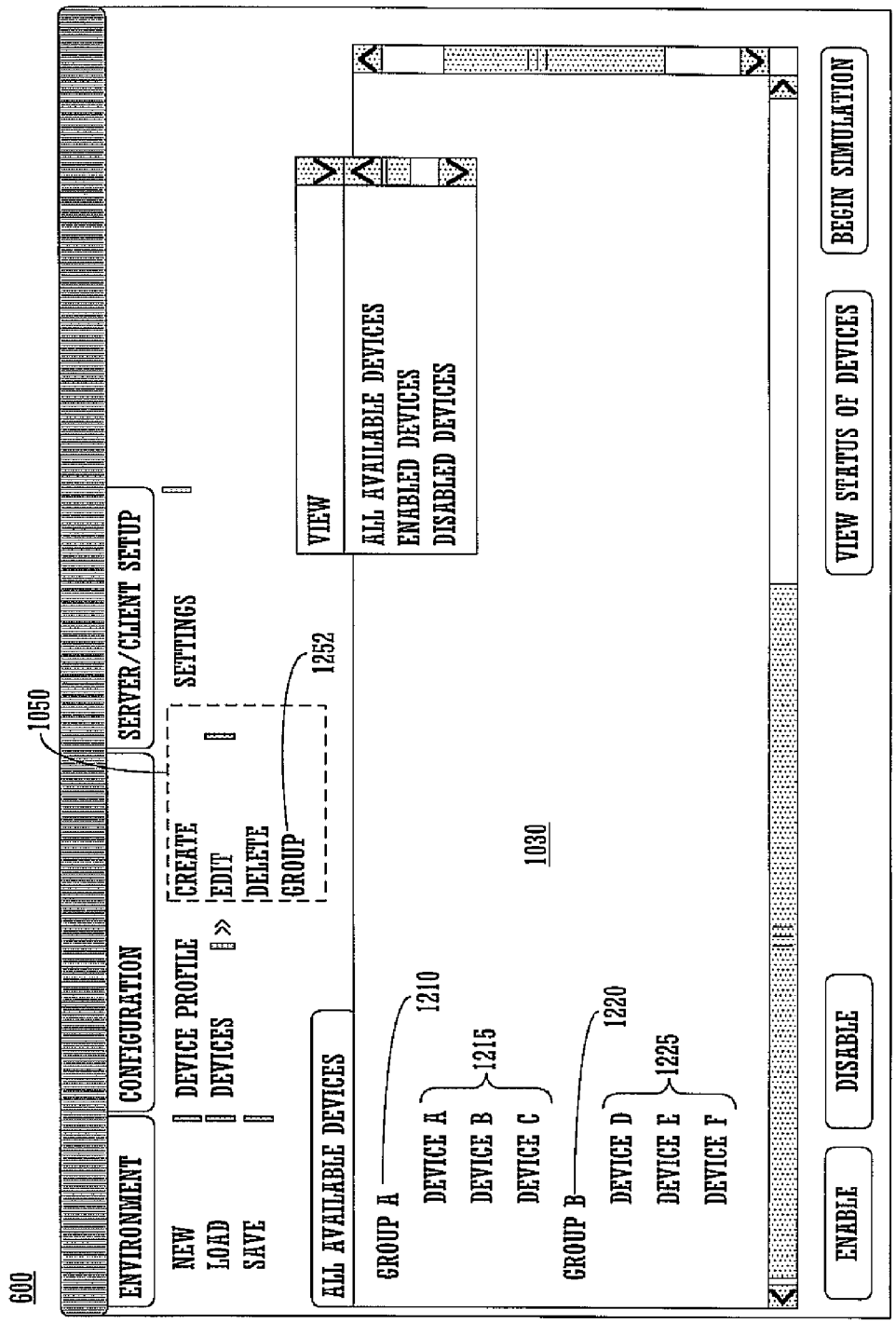
FIG. 12 shows an exemplary on-screen computer-implemented graphical user interface displaying a grouping of devices in accordance with one embodiment of the present invention.
Figure 13:
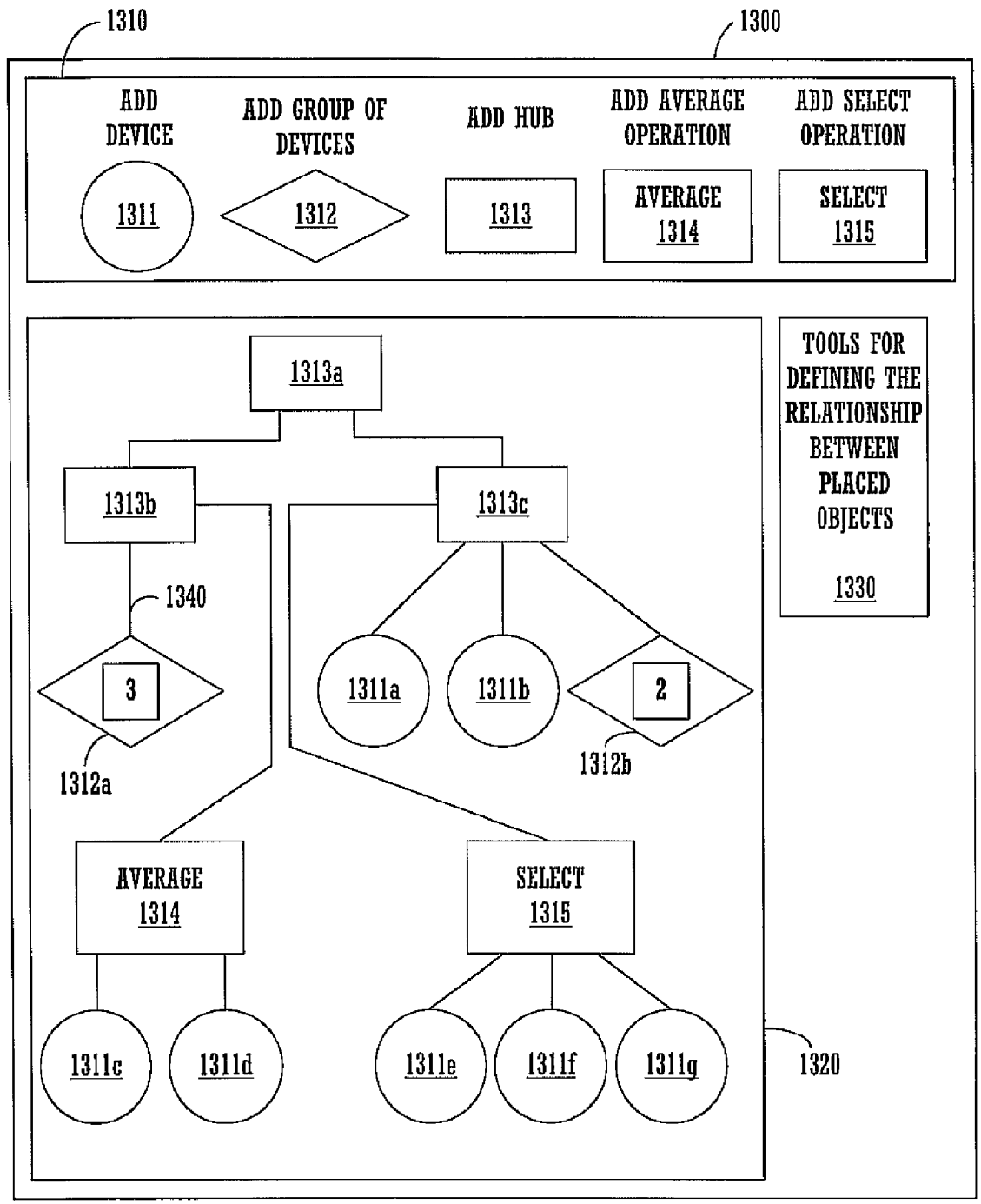
FIG. 13 shows an exemplary on-screen computer-implemented graphical user interface using an object-based approach for configuring a simulator in accordance with one embodiment of the present invention.

FIG. 12 shows exemplary on-screen computer-implemented GUI 600 displaying a grouping of devices in accordance with one embodiment of the present invention. Grouping devices helps in managing data to and from the group. Additionally, grouping devices can also help in assigning group functionality or attributes for implementation during simulation of devices from the group. As stated above, device groups can receive and respond to commands within the simulation architecture.

As shown in FIG. 12, devices displayed within region 1030 may be grouped into a plurality of groups. For example, devices 1215 may be grouped into first group 1210, while devices 1225 may be grouped into second group 1220. Grouping may be performed, in one embodiment, by highlighting or otherwise selecting devices to be grouped (e.g., devices 1215, devices 1225, etc.) and interacting with region 1252 (e.g., of region 1050) to group the devices.

Once a grouping of devices is created, information or attributes for each device within the grouping may be changed or defined (e.g., using a GUI for configuring a device grouping). For example, changing a data range of the simulated device data for the group of devices may change and/or override a data range entered for individual devices of the group.

Additionally, information about a communicative coupling of the devices may be defined using GUI 600 in one embodiment. For example, the simulator (e.g., 220) may be configured to generate and/or output simulated device data for a single device (e.g., "Device A") even though the group of device comprise multiple devices (e.g., "Device A," "Device B," and "Device C"). As another example, the simulator (e.g., 220) may be configured to generate and/or output simulated device data for a group which represents an average of the respective simulated device data associated with each device of the group.

FIG. 13 shows exemplary on-screen computer-implemented GUI 1300 using an object-based approach for configuring a simulator in accordance with one embodiment of the present invention. For example, devices to be simulated may be placed in display region 1320, where the devices may be configured by a user for simulation. More specifically, device configuration data may be generated based upon user-configuration of devices placed in region 1320, where the configuration may include individual device configuration (e.g., defining one or more attributes for a given device), group device configuration (e.g., defining an attribute for a group of devices, defining which devices are included in a given device group, etc.), a communicative coupling of devices or device groups, and the like. The device configuration data may be used by the simulator (e.g., 220) to instantiate and simulate the devices (e.g., to generate simulated device data for the devices based upon the configuration, etc.).

As shown in FIG. 13, region 1310 of GUI 1300 includes device object 1311, group object 1312, hub object 1313, average object 1314, and select object 1315. Instances of objects 1311-1315 may be placed in region 1320 (e.g., by dragging and dropping one of objects 1311-1315 into region 1320) for defining components corresponding to the objects. For example, device object 1311 may be dragged and dropped in region 1320 to create device 1311a (e.g., similar to one of simulated devices 225a-225d), where device 1311a may be a device for simulation by a simulator (e.g., 220).

Figure 14:
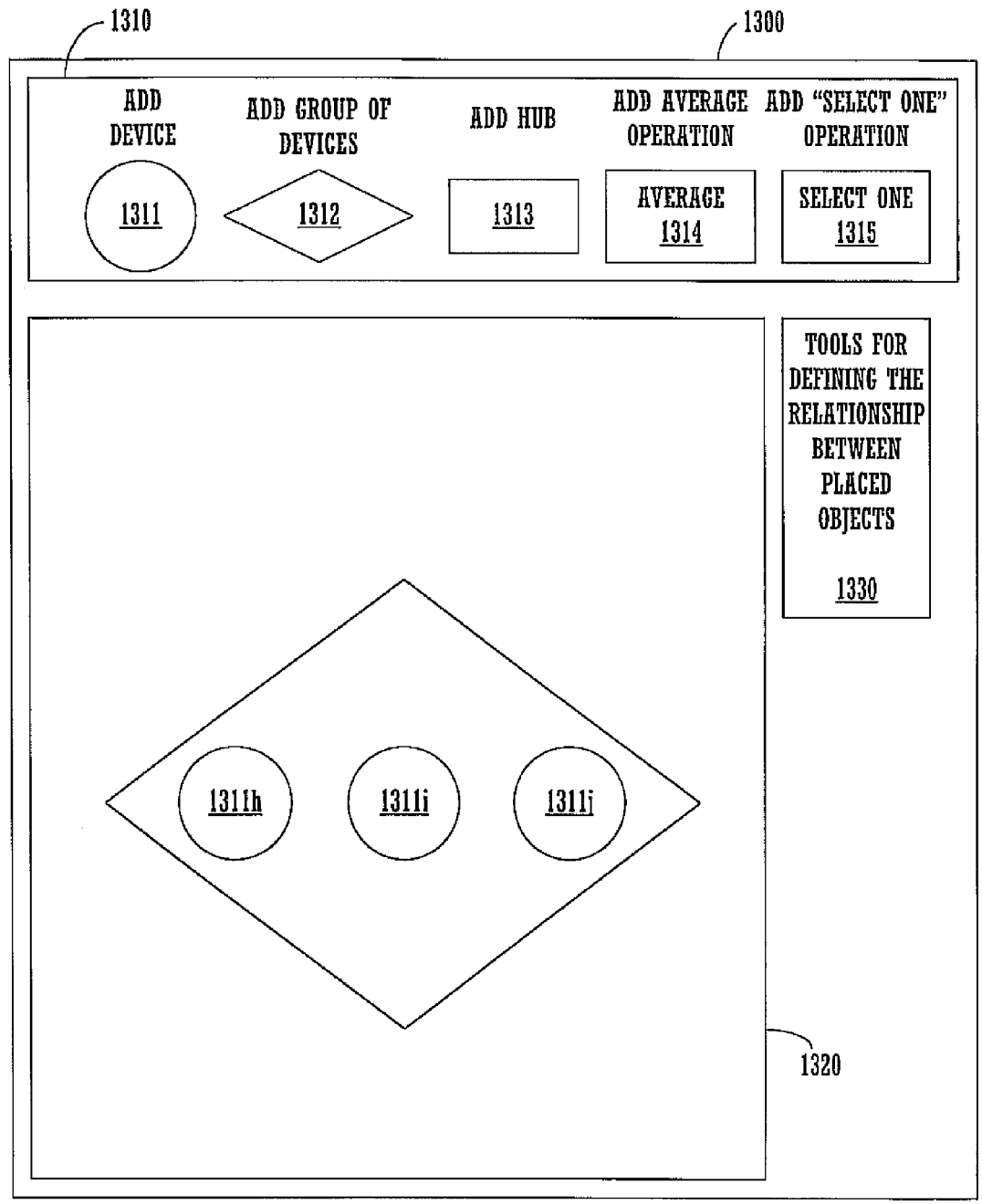
FIG. 14 shows an exemplary on-screen computer-implemented graphical user interface with a device grouping including a plurality of devices in accordance with one embodiment of the present invention.

Group object 1312 may be dragged and dropped in region 1320 to create device group (e.g., 1312*a*), where the device group may be a group of devices for simulation by a simulator. For example, group 1312*a* may include three devices as indicated by the number "3" within group 1312*a*. Further, the devices within a device group (e.g., 1312*a*) may be viewed by interacting with the device group (e.g., the graphical object representing device group 1312*a*), where FIG. 14 shows exemplary on-screen computer-implemented GUI 1300 with a device grouping including a plurality of devices in accordance with one embodiment of the present invention. As shown in FIG. 14, device group 1312*a* may include devices 1311*h*, 1311*i*, and 1311*j*.

Turning back to FIG. 13, hub object 1313 may be dragged and dropped in region 1320 to create a hub component (e.g., 1313*a*), where the hub component may be a data hub for accessing, packaging, and communicating simulated output data from multiple devices or device groups. Average object 1314 may be dragged and dropped in region 1320 to create an average component (e.g., 1314*a*), where the average component may be a component for generating new simulated output data based upon an average of simulated device data for multiple devices (e.g., 1311*c* and 1311*d*). Additionally, select object 1315 may be dragged and dropped in region 1320 to create a select component (e.g., 1315*a*), where the select component may be a component for communicating simulated device data (e.g., the simulated device data of device 1311*e*, 1311*f*, or 1311*g*) selected from the simulated device data for multiple devices (e.g., 1311*e*, 1311*f* and 1311*g*).

In one embodiment, objects may be placed and/or arranged in region 1320 by dragging and dropping objects from region 1310, by dragging and dropping objects to new locations within region 1320, or the like. Additionally, a communicative coupling may be defined using tools selected from region 1330, where the tools of region 1330 may include a line tool (e.g., for connecting or coupling one object to another, one object to a group of objects, a group of objects to another group of objects, etc.) and/or other tools. In this manner, devices 1311*c* and 1311 may each be connected or coupled to average component 1314, device group 1312*a* may be connected or coupled to hub component 1313*b*, or the like.

Accordingly, GUI 1300 may be used to define how simulated device data is accessed, collected, and communicated. For example, hub component 1313*b* may access and/or package simulated device data from device group 1312*a* (e.g., outputting simulated device data for each of the devices of device group 1312*a*) and average component 1314 (e.g., outputting simulated device data representing an average of the simulated device data from devices 1311*c* and 1311*d*). Hub component 1313*c* may access and/or package simulated device data from select component 1315 (e.g., outputting simulated device data from device 1311*e*, 1311*f*, or 1311*g*), device 1311*a*, device 1311*b*, and device group 1312*b* (e.g., outputting simulated device data for each of the devices of device group 1312*b*). Further, hub component 1313*a* may access and/or package simulated device data from hub components 1313*b* and 1313*c*. In this manner, embodiments enable a user to define an arrangement and/or communicative coupling of devices which may more accurately represent an arrangement of actual devices (e.g., corresponding to each of the simulated components) in a device environment (e.g., 120 of FIG. 1).

Components defined using objects 1311-1315 may be configured using GUI 1300. For example, user interaction with an object representing the component to be configured may display a GUI (e.g., 1100 of FIG. 11, etc.) for defining attributes or otherwise configuring the component. Alternatively, the communication paths coupling the components in region 1320 may be configured. For example, path 1340 may be configured (e.g., by displaying a GUI or other configuration mechanism for configuring a path in response to a user interaction with path 1340) to report data for less than all of the devices of group 1312*a*.

Turning back to FIG. 5B, step 540 involves generating configuration data based upon configuration of a device profile and/or devices (e.g., 225*a*-225*d*). For example, information entered using a GUI for defining a device profile (e.g., GUI 370, GUI 600, GUI 700, GUI 800, etc.) and/or defining a device (e.g., GUI 370, GUI 600, GUI 900, GUI 1100, etc.) may be accessed (e.g., by simulation engine 322) and used to generate configuration data. Step 540 may be performed in response to interaction with button or region 1080 of GUI 600 in one embodiment.

Step 550 involves storing the configuration data for access by the simulator (e.g., 220) and/or enabling simulation of the devices (e.g., 225*a*-225*d*). The configuration data may be stored in a memory (e.g., database 324) accessible to the simulator (e.g., 220). Step 550 may be performed in response to interaction with button or region 1080 of GUI 600 in one embodiment.

Computer System Platform

Figure 16:
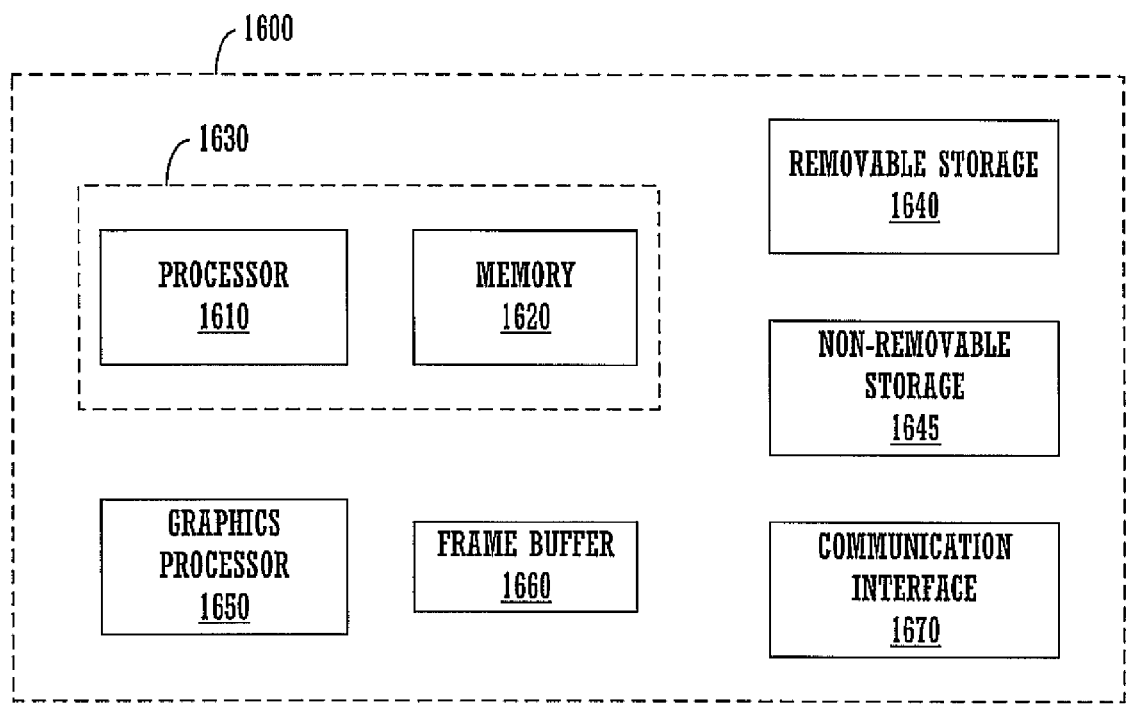
FIG. 16 shows an exemplary computer system platform upon which embodiments of the present invention may be implemented.

FIG. 16 shows exemplary general purpose computer system platform 1600 upon which embodiments of the present invention may be implemented. For example, computer system 1600 may be used to implement one or more components of system 100 in one embodiment. As another example, computer system 1600 may be used to implement one or more components of system 200.

As shown in FIG. 16, portions of the present invention are comprised of computer-readable and computer-executable instructions that reside, for example, in computer system platform 1600 and which may be used as a part of a general purpose computer network (not shown). It is appreciated that computer system platform 1600 of FIG. 16 is merely exemplary. As such, the present invention can operate within a number of different systems including, but not limited to, general-purpose computer systems, embedded computer systems, laptop computer systems, hand-held computer systems, portable computer systems, and stand-alone computer systems, for instance.

In one embodiment, depicted by dashed lines 1630, computer system platform 1600 may comprise at least one processor 1610 and at least one memory 1620. Processor 1610 may comprise a central processing unit (CPU) or other type of processor. Depending on the configuration and/or type of computer system environment, memory 1620 may comprise volatile memory (e.g., RAM), non-volatile memory (e.g., ROM, flash memory, etc.), or some combination of the two. Additionally, memory 1620 may be removable, non-removable, etc.

In other embodiments, computer system platform 1600 may comprise additional storage (e.g., removable storage 1640, non-removable storage 1645, etc.). Removable storage 1640 and/or non-removable storage 1645 may comprise volatile memory, non-volatile memory, or any combination thereof. Additionally, removable storage 1640 and/or non-removable storage 1645 may comprise CD-ROM, digital versatile disks (DVD) or other optical storage, magnetic cassettes, magnetic tape, magnetic disk storage or other magnetic storage devices, or any other medium which can be used to store information for access by computer system platform 1600.

As shown in FIG. 16, computer system platform 1600 may communicate with other systems, components, or devices via communication interface 1670. Communication interface 1670 may embody computer readable instructions, data structures, program modules or other data in a modulated data signal (e.g., a carrier wave) or other transport mechanism. By way of example, and not limitation, communication interface 1670 may couple to wired media (e.g., a wired network, direct-wired connection, etc.) and/or wireless media (e.g., a wireless network, a wireless connection utilizing acoustic, RF, infrared, or other wireless signaling, etc.).

Communication interface 1670 may also couple computer system platform 1600 to one or more input devices (e.g., a keyboard, mouse, pen, voice input device, touch input device, etc.). Additionally, communication interface 1670 may couple computer system platform 1600 to one or more output devices (e.g., a display, speaker, printer, etc.).

As shown in FIG. 16, graphics processor 1650 may perform graphics processing operations on graphical data stored in frame buffer 1660 or another memory (e.g., 1620, 1640, 1645, etc.) of computer system platform 1600. Graphical data stored in frame buffer 1660 may be accessed, processed, and/or modified by components (e.g., graphics processor 1650, processor 1610, etc.) of computer system platform 1600 and/or components of other systems/devices. Additionally, the graphical data may be accessed (e.g., by graphics processor 1650) and displayed on an output device coupled to computer system platform 1600. Accordingly, memory 1620, removable storage 1640, non-removable storage 1645, fame buffer 1660, or a combination thereof, may comprise instructions that when executed on a processor (e.g., 1610, 1650, etc.) implement a method of configuring a simulator (e.g., 220) and performing a simulation of a plurality of devices (e.g., 225a-225d).

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A method of configuring a simulator, said method comprising:
    generating a graphical user interface for display on a computer system, wherein said graphical user interface is operable to generate, based on a user interaction with said graphical user interface, configuration data operable to define a plurality of simulated devices for instantiation by said simulator for analyzing a performance of a system under test, said graphical user interface comprising an on-screen display operable to allow a user to define a customized attribute for at least one simulated device of said plurality of simulated devices, wherein said customized attribute is unique to said at least one simulated device;
    generating said configuration data for said plurality of simulated devices;
    storing said configuration data in a first database comprised in said simulator, and a second database comprised in a device abstraction layer, the device abstraction layer being included in said system under test and logically disposed between said plurality of simulated devices and a plurality of applications, said abstraction layer further comprising a device configuration management component and a device monitoring component;
    configuring, via the device configuration management component, said device abstraction layer based on said configuration data stored in said second database to implement communication between said simulator and the device monitoring component operable to process received simulated output data from said plurality of simulated devices;
    automatically instantiating said plurality of simulated devices by said simulator;
    communicating a request to said device abstraction layer for a plurality of commands associated with said plurality of simulated devices;
    accessing said plurality of commands communicated from said device abstraction layer by said simulator; and
    generating simulated device data based on an execution of said plurality of commands and said configuration data stored in said first database;
    wherein said simulator is operable to generate said simulated device data for a subset of said plurality of simulated devices based on said configuration data,
    wherein said simulated device data is operable to be used to analyze a performance of an additional component of the system under test coupled to receive said simulated device data, and
    wherein analyzing the performance of the system under test includes analyzing performance of said device abstraction layer.

2. The method of claim 1, further comprising: automatically instantiating said plurality of simulated devices in a memory accessible by said simulator.

3. The method of claim 1, wherein said additional component comprises a business application of said plurality of applications.

4. The method of claim 1, wherein each of said plurality of simulated devices is selected from a group consisting of a sensor, an embedded device, a portable electronic device, and a data hub operable to access data from said plurality of simulated devices.

5. The method of claim 1, wherein said configuration data comprises a device profile, the device profile comprising at least one attribute selected from a group consisting of a format of said simulated device data, a rate at which said simulated device data is output by said simulator, a range of values for said simulated device data, and an operating parameter of at least one of said plurality of simulated devices for inclusion in said simulated device data.

6. The method of claim 1, wherein said graphical user interface further comprises an on-screen display operable to allow a user to define a communicative coupling of said plurality of simulated devices, and wherein generating said configuration data for said plurality of simulated devices is based upon said communicative coupling of said plurality of simulated devices.

7. The method of claim 1, wherein said graphical user interface further comprises an on-screen display operable to allow a user to group said plurality of simulated devices into a plurality of groups, wherein said on-screen display is further operable to allow a user to define a customized attribute for each simulated device of at least one group of said plurality of groups.

8. The method of claim 1, wherein said graphical user interface is further operable to receive user input corresponding to a change in configuration data for said portion of said plurality of simulated devices, and wherein said simulator changes said configuration data for said portion of said plurality of simulated devices.

9. The method of claim 8, wherein said simulator changes said configuration data for said portion of said plurality of simulated devices after said portion of said plurality of simulated devices is instantiated.

10. The method of claim 1, wherein said configuration data comprises at least one attribute of said plurality of simulated devices, said at least one attribute comprising a range of data values.

11. The method of claim 1, wherein said configuration data comprises at least one attribute of said plurality of simulated devices said at least one attribute comprising a frequency for generating said simulated device data wherein said.

12. The method of claim 1, wherein said configuration data comprises at least one attribute of said plurality of simulated devices, said at least one attribute comprising a format for an output of said simulated device data.

13. The method of claim of claim 1, wherein said graphical user interface is further operable to allow a user to generate an average device, said average device being configured to generate simulated device data based on said average of simulated device data for said plurality of simulated devices.

14. The method of claim 1, wherein said graphical user interface is further operable to:
define a quantity of said plurality of simulated devices for instantiation by said simulator; and
designate a subset of said plurality of simulated devices in a said plurality of device environments for simulation.

15. A computer system comprising a processor coupled to a bus and a memory coupled to said bus, wherein said memory comprises instructions that when executed implement a method of configuring a simulator, said method comprising:
generating a graphical user interface for display on a computer system, wherein said graphical user interface is operable to generate, based on user interaction with said graphical user interface, configuration data operable to define a plurality of simulated devices for instantiation by said simulator for analyzing a performance of a system under test, said graphical user interface comprising an on-screen display operable to allow a user to define a customized attribute for at least one simulated device of said plurality of simulated devices, wherein said customized attribute is unique to said at least one simulated device;
generating said configuration data for said plurality of simulated devices;
storing said configuration data in a first database comprised in said simulator, and a second database comprised in a device abstraction layer, the device abstraction layer being included in said system under test and logically disposed between said plurality of simulated devices and a plurality of applications, said abstraction layer further comprising a device configuration management component and a device monitoring component;
configuring, via the device configuration management component, said device abstraction layer to implement communication between said simulator and the device monitoring component operable to process received simulated output data from said plurality of simulated devices an based on said configuration data as stored in said second database;
automatically instantiating the plurality of simulated devices by said simulator;
communicating a request to said device abstraction layer for a plurality of commands associated with said plurality of simulated devices;
accessing said plurality of commands communicated from said device abstraction layer by said simulator; and
generating simulated device data based on an execution of said plurality of commands and said configuration data stored in said first database;
wherein said simulator is operable to generate said simulated device data for said subset of plurality of simulated devices based on said configuration data,
wherein said simulated device data is operable to be used to analyze a performance of an additional component of the system under test coupled to receive said simulated device data, and
wherein analyzing the performance of the system under test includes analyzing performance of said device abstraction layer.

16. The computer system of claim 15, wherein said method further comprises:
automatically instantiating said plurality of simulated devices in a memory accessible by said simulator.

17. The computer system of claim 15, wherein said additional component corresponds to a business application of said plurality of applications.

18. The computer system of claim 15, wherein each of said plurality of simulated devices is selected from a group consisting of a sensor, an embedded device, a portable electronic device, and a data hub operable to access data from a plurality of simulated devices.

19. The computer system of claim 15, wherein said configuration data comprises a device profile, the device profile comprising at least one attribute selected from a group consisting of a format of said simulated device data, a rate at which said simulated device data is output by said simulator, a range of values for said simulated device data, and an operating parameter of at least one of said plurality of simulated devices for inclusion in said simulated device data.

20. The computer system of claim 15, wherein said graphical user interface comprises an on-screen display operable to allow a user to define a communicative coupling of said plurality of simulated devices, and wherein generating said configuration data comprises: generating said configuration data for said plurality of simulated devices based upon said communicative coupling of said plurality of simulated devices.

21. The computer system of claim 15, wherein said graphical user interface comprises an on-screen display operable to allow a user to group said plurality of simulated devices into a plurality of groups, wherein said graphical user interface is further operable to allow a user to define a customized attribute for each simulated device of at least one group of said plurality of groups.

22. A system for configuring a simulator, the system comprising:
a graphical user interface configured to receive user interaction and to generate a configuration data operable to define a plurality of simulated devices based on the received user interaction, said graphical user interface comprising an on-screen display operable to allow a user to define a customized attribute for at least one simulated device of said plurality of simulated devices, wherein said customized attribute is unique to said at least one simulated device and said graphical user interface further configured to generate said configuration data for said plurality of simulated devices, said graphical user interface displayed on a screen;

a simulator for analyzing a performance of a system under test, said simulator executed on one or more processors, the simulator comprising:
  a first database for storing the configuration data;
  a simulation engine configured to instantiate the plurality of simulated devices based on the configuration data and to generate simulated device data in the plurality of simulated devices;
  a plurality of applications configured to receive the simulated device data; and
  a device abstraction component included in said system under test and logically disposed between the plurality of applications and the simulator and configured, via a device configuration management component, to implement communication between the simulator and a device monitoring component operable to process received simulated output data from said plurality of simulated devices an based on the configuration data, the device abstraction component comprising a second database configured to store the configuration data from the first database, said abstraction layer further comprising a device configuration management component and a device monitoring component;
  wherein the device abstraction component is configured based on the configuration data stored in the second database,
  wherein the simulator is operable to generate the simulated device data for a subset of plurality of simulated devices in the plurality of device environments based on the configuration data, and
  wherein the simulated device data is operable to be used to analyze a performance of an additional component of the system under test coupled to receive said simulated device data, and wherein analyzing the performance of the system under test includes analyzing performance of said device abstraction layer;
  the screen and the one or more processors.

23. The system of claim 22, wherein each of the plurality of simulated devices is selected from a group consisting of a sensor, an embedded device, a portable electronic device, and a data hub operable to access data from a plurality of simulated devices.

24. The system of claim 22, wherein the configuration data comprises at least one attribute selected from the group consisting of: a format of the simulated device data, a rate at which the simulated device data is output by the simulator, a range of values for the simulated device data, and an operating parameter of at least one of the plurality of simulated devices for inclusion in the simulated device data.

25. The system of claim 22 wherein the graphical user interface is further configured to allow a user to define a communicative coupling of the plurality of simulated devices, and wherein the communicative coupling of the plurality of simulated devices is for generating the configuration data for the plurality of simulated devices.

26. The system of claim 22 wherein the graphical user interface is further configured to receive user input corresponding to a change in the configuration data for a portion of the plurality of simulated devices, and wherein the simulator changes the configuration data for the portion of the plurality of simulated devices.

* * * * *

UNITED STATES PATENT AND TRADEMARK OFFICE
CERTIFICATE OF CORRECTION

PATENT NO. : 8,893,035 B2  Page 1 of 1
APPLICATION NO. : 12/212573
DATED : November 18, 2014
INVENTOR(S) : Michael J. Biltz et al.

It is certified that error appears in the above-identified patent and that said Letters Patent is hereby corrected as shown below:

On the Title page,

Page 2, column 2 (Other Publications), line 5, delete "Platfor" and insert -- Platform --, therefor.

Page 2, column 2 (Other Publications), line 6, delete "Niagra" and insert -- Niagara --, therefor.

In the Claims,

Column 19, line 31, claim 14, after "a" delete "said".

Column 19, line 64, claim 15, after "devices" delete "an".

Column 21, line 18, claim 22, after "devices" delete "an".

Signed and Sealed this
Eighteenth Day of August, 2015

Michelle K. Lee
*Director of the United States Patent and Trademark Office*